United States Patent
Bhat et al.

(10) Patent No.: US 11,362,648 B2
(45) Date of Patent: Jun. 14, 2022

(54) PRE-DISCHARGING BASED FLIP-FLOP WITH A NEGATIVE SETUP TIME

(71) Applicant: Samsung Electronics Co., Ltd., Suwon-si (KR)

(72) Inventors: Aroma Bhat, Bengaluru (IN); Abdur Rakheeb, Bengaluru (IN); Arani Roy, Bengaluru (IN); Mitesh Goyal, Bengaluru (IN); Abhishek Ghosh, Bengaluru (IN)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/118,082

(22) Filed: Dec. 10, 2020

(65) Prior Publication Data

US 2021/0184660 A1 Jun. 17, 2021

(30) Foreign Application Priority Data

Dec. 11, 2019 (IN) .............................. 201941051311
Dec. 7, 2020 (IN) .............................. 201941051311

(51) Int. Cl.
*H03K 3/3562* (2006.01)
*G01R 31/3177* (2006.01)
(Continued)

(52) U.S. Cl.
CPC ..... *H03K 3/35625* (2013.01); *G01R 31/3177* (2013.01); *H03K 3/012* (2013.01); *H03K 3/027* (2013.01)

(58) Field of Classification Search
CPC .... H03K 3/012; H03K 3/027; H03K 3/35625; G01R 31/3177
See application file for complete search history.

(56) References Cited

U.S. PATENT DOCUMENTS

| 10,200,018 | B2 | 2/2019 | Xue et al. |
| 2012/0146697 | A1* | 6/2012 | Leach ................ H03K 3/35625 327/202 |
| 2016/0301392 | A1 | 10/2016 | Korolev et al. |

FOREIGN PATENT DOCUMENTS

| CN | 1741381 B | 4/2010 |
| CN | 1761153 B | 5/2010 |
| KR | 20090059580 A | 6/2009 |

OTHER PUBLICATIONS

Extended European Search Report Corresponding to European Application No. 20213249.4 (9 pages) (dated May 11, 2021).
(Continued)

*Primary Examiner* — Sibin Chen
(74) *Attorney, Agent, or Firm* — Myers Bigel, P.A.

(57) ABSTRACT

A pre-discharging based flip-flop having a negative setup time can include a flip-flop with an inverted output QN. The flip-flop includes a master section and a slave section. The master section latches a data input or a scan input signal based on a scan enable signal, and the slave section retains a previous value of the inverted output QN when a clock signal is at a low logic level. The master section retains a previously latched value of the data input or the scan input signal and the slave section fetches the latched value of the master section and provides a new inverted output QN when the clock signal is at a high logic level. Further, the master section includes sub-sections that are operated using a negative clock signal. An output of the master section is discharged to zero for a half of a phase of the clock cycle.

20 Claims, 14 Drawing Sheets

(51) Int. Cl.
H03K 3/027 (2006.01)
H03K 3/012 (2006.01)

(56) References Cited

OTHER PUBLICATIONS

Kim et al. "Single-ended D flip-flop with implicit scan mux for high performance mobile AP" 2016 29th IEEE International System-on-Chip Conference (SOCC) (pp. 91-95) (Sep. 6, 2016).

* cited by examiner

PRE-DISCHARGING BASED FLIP-FLOP WITH A NEGATIVE SETUP TIME

REFERENCE TO PRIORITY APPLICATION

This application claims priority to Indian Non-provisional Patent Application No. 201941051311, filed on Dec. 7, 2020 and to Indian Provisional Application 201941051311, filed Dec. 11, 2019, the disclosures of which are hereby incorporated herein by reference.

FIELD

The present disclosure relates to the field of flip-flops and more particularly to pre-discharging based flip-flops with a negative setup time.

BACKGROUND

Flip-flops are used in sequential logic circuits, standard cell libraries, and so on to temporarily store binary data or to perform scan test operations. Performance of the flip-flop may be analyzed in terms of parameters such as, but not limited to, System on Chip (SoC) area, delay and power. Optimization of such parameters may enhance the performance of the flip-flop and block level gain in the flip-flop.

FIG. 1 is a circuit diagram depicting a conventional scan flip-flop 100. As depicted in FIG. 1, the scan flip-flop 100 includes a multiplexer 102, a master latch 104, and a slave latch 106. The multiplexer 102 can be implemented as a cross-coupled structure. The multiplexer 102 receives a data input signal D, and a scan input signal SI. The multiplexer 102 selects one signal from the data input signal D, and the scan input signal (depending on a logic level of a scan enable signal SE/operation mode) and provides the selected signal as an internal signal (IS) to the master latch 104.

The master latch 104 may latch the internal signal IS based on a clock signal (CLK). The slave latch 106 may latch an output of the master latch 104 to supply an output signal Q, based on the clock signal CLK. However, the multiplexer path for the data input signal D makes data input slower, thereby resulting in a higher set-up time and a larger delay in the data input to the output path (i.e. from the D to the output Q). Further, the multiplexer 102 with the cross-coupled structure may be prone to more variations. In addition, manufacturing of the multiplexer 102 with the cross-coupled structure may be expensive.

SUMMARY

Embodiments of the invention include a pre-discharging based flip-flop having a negative setup time. Additional embodiments of the invention include methods and systems for enabling a master section of the flip-flop to operate using a negative clock signal, which reduces setup time of the flip-flop to a negative value. Further embodiments of the invention include methods and systems for discharging an output of the master section to zero for a half of phase of the clock signal. Additional embodiments of the invention include methods and systems for optimizing a slave section of the flip-flop to thereby reduce clock (CK)-to-inverted output (QN) delay.

According to further embodiments of the invention, a pre-discharging based flip-flop is provided with a negative set-up time. The flip-flop includes a master section, and a slave section coupled to the master section. The master section is configured to latch at least one of a data input and a scan input signal based on a scan enable signal when a clock signal is at a logic low level, and retain previously latched at least one of the data input and the scan input signal when the clock signal is at a high logic level. The slave section is configured to generate an inverted output QN using the latched at least one of the data input and the scan input signal received from the master section (202), at a positive edge of the clock signal, and retain a previous value of the inverted output QN, when the clock signal is at the logic low level.

These and other aspects of the example embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of the example embodiments herein without departing from the spirit thereof, and the example embodiments herein include all such modifications.

BRIEF DESCRIPTION OF THE DRAWINGS

Embodiments herein are illustrated in the accompanying drawings, throughout which like reference letters indicate corresponding parts in the various figures. The embodiments herein will be better understood from the following description with reference to the drawings, in which.

DETAILED DESCRIPTION

Figure 1:
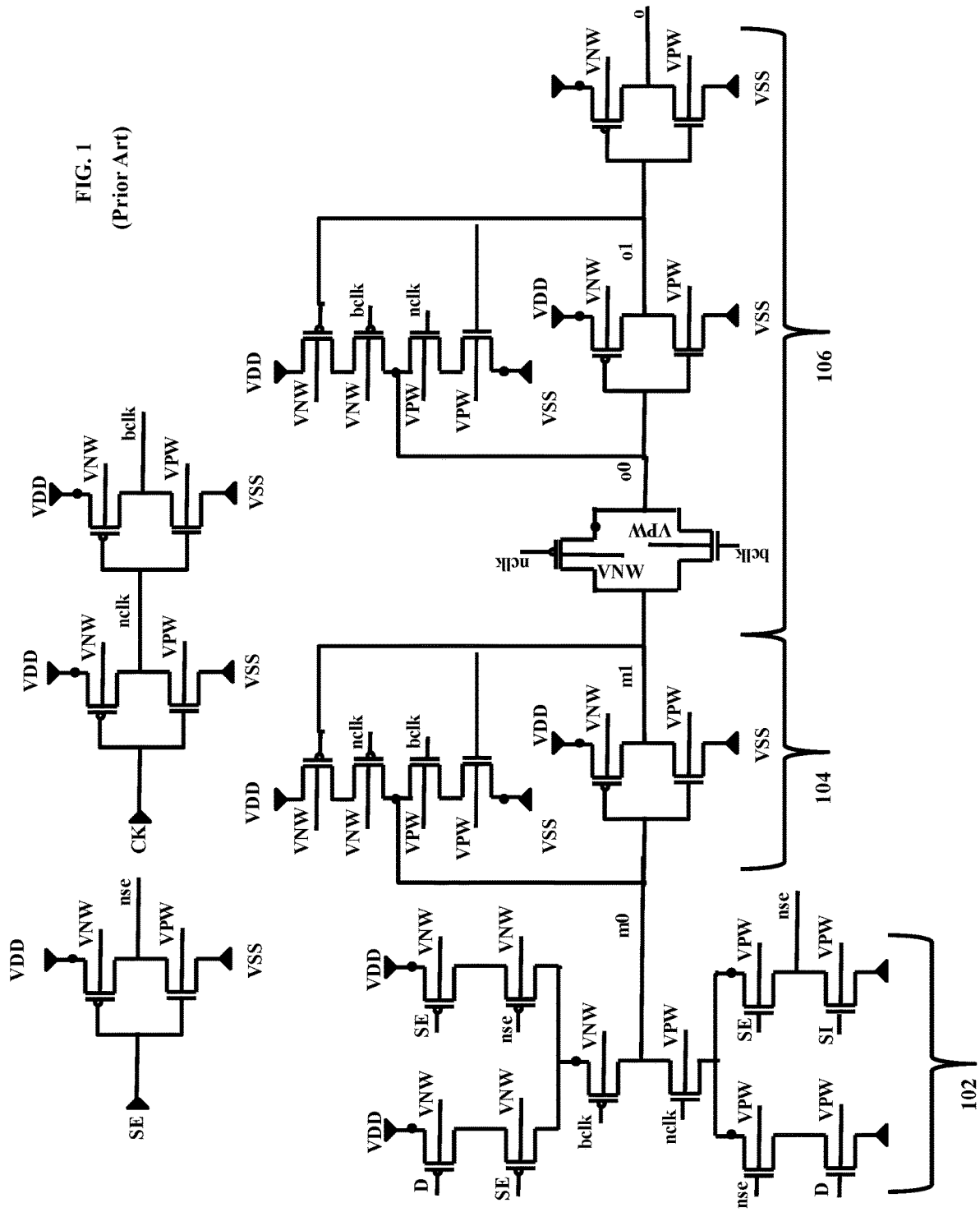
FIG. 1 is a circuit diagram depicting a conventional scan flip-flop.

The example embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The description herein is intended merely to facilitate an understanding of ways in which the example embodiments herein can be practiced and to further enable those of skill in the art to practice the example embodiments herein. Accordingly, this disclosure should not be construed as limiting the scope of the example embodiments herein.

Embodiments herein disclose a pre-discharging based flip-flop with a negative setup time.

Embodiments herein disclose methods and systems for enabling a master section of the flip-flop to operate using a negative clock signal that reduces setup time of the flip-flop to a negative value and discharging an output of the master section to zero for a half of phase of the clock signal.

Embodiments herein is to disclose methods and systems for optimizing a slave section of the flip-flop to reduce clock (CK)-to-inverted output QN (QN) delay.

Referring now to the drawings, and more particularly to FIGS. 2a through 12, where similar reference characters denote corresponding features consistently throughout the figures, there are shown example embodiments.

Figure 2A:
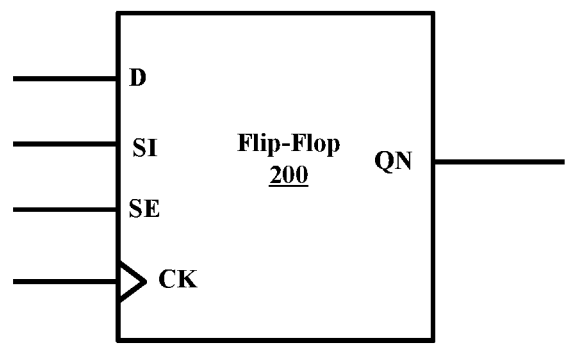
FIGS. 2a and 2b depict a flip-flop, according to embodiments as disclosed herein.
Figure 2B:
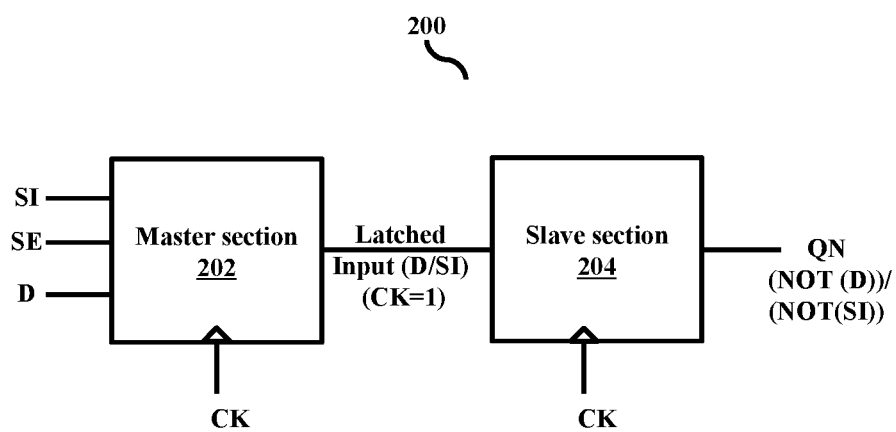

FIGS. 2a and 2b depict a flip-flop 200, according to embodiments as disclosed herein. The flip-flop 200 may be implemented in an integrated circuit of an electronic device (not shown). Examples of the electronic device, can be, but is not limited to, a mobile phone, a smartphone, a tablet, a phablet, a personal digital assistant (PDA), a laptop, a computer, a wearable computing device, a server, a vehicle infotainment device, an Internet of Things (IoT) device, or any other device which comprises at least one flip-flop 200. In an embodiment, the integrated circuit may be defined by at least one of, but is not limited to, a plurality of cells/standardized logic circuit blocks, sequential logic circuits, high performance application processors, high-performance arithmetic blocks, and so on. The plurality of cells may be designed using a cell library. The cell library includes characteristic information of the plurality of cells such as, but not limited to, a name of a cell, a dimension, a gate width, a pin, delay characteristic, a leakage current, a threshold voltage, a function, and so on. The cell library set may also include basic cells such as, but not limited to, an AND gate, an OR gate, a NOR gate, an inverter, and so on. The cell library set may also include, complex cells such as, but not limited to, an OR/AND/INVERER (OAI) gate, an AND/OR/INVERTER (AOI) gate, and so on.

As depicted in the example in FIG. 2a, the flip-flop 200 referred herein can be a D flip-flop/scan D flip-flop with an inverted output QN. The flip-flop 200 can include two inputs: a data input D, and a scan input signal SI. The flip-flop 200 can operate in two modes by selecting one of the inputs using a scan enable signal SE. The modes can be a normal/functional mode, and a scan mode/test mode. When the control signal is low, the flip-flop 200 operates in the normal mode. In the normal mode, the flip-flop 200 latches/stores the data input D. When the scan enable signal SE is high, the flip-flop 200 operates in the scan mode. In the scan mode, the flip-flop 200 selects a scan input signal SI and performs scan test operations based on the clock signal CK. The scan test operations include setting a certain number of flip-flops present in a scan chain through the scan enable signal SE, and the scan input signal SI and implementing certain test patterns to check its correctness at outputs of the flip-flops in the scan chain.

In an embodiment, as depicted in FIG. 2b, the flip-flop 200 includes a master section/latch 202, and a slave section/latch 204.

The master section 202 can be configured to latch the data input D or the scan input signal SI based on the scan enable signal SE, when the clock signal CK is at a low logic level ('0'). In an example, when the clock signal CK=0, and the scan enable SE=0 (i.e., the normal mode of operation), the master section 202 stores/latches the data input D. In an example, when the clock signal CK=0, and the scan enable signal SE=1 (i.e., the scan mode of operation), the master section 202 latches the scan input signal SI. The master section 202 can be configured to retain its previously latched input based on the scan enable signal SE, when the clock signal CK is at a high logic level ('1').

The slave section 204 can be configured to retain a previous value of the inverted output QN, when the clock signal CK is at the low logic level ('0'). The slave section 204 can be configured to produce a new value of the inverted output QN based on the latched input of the master section 202, when the clock signal CK is at the high logic level ('1'). The new value of the inverted output QN may correspond to an inversion of the latched input of the master section 202. In an example, when the clock signal CK=1, and the latched input of the master section 202 is the data input D, the slave section 204 produces an inversion of the data input D as the new value of the inverted output QN. In an example, when the clock signal CK=1, and the latched input of the master section 202 is the scan input signal SI, the slave section 204 produces an inversion of the scan input signal SI as the new value of the inverted output QN. Thus, at the clock signal CK=1 (i.e., at a positive edge of the clock signal), the master section 202 forwards the latched input to the slave section 204, and the slave section 204 produces the inversion of the received latched input of the master section 202 as the inverted output QN.

Figure 3A:
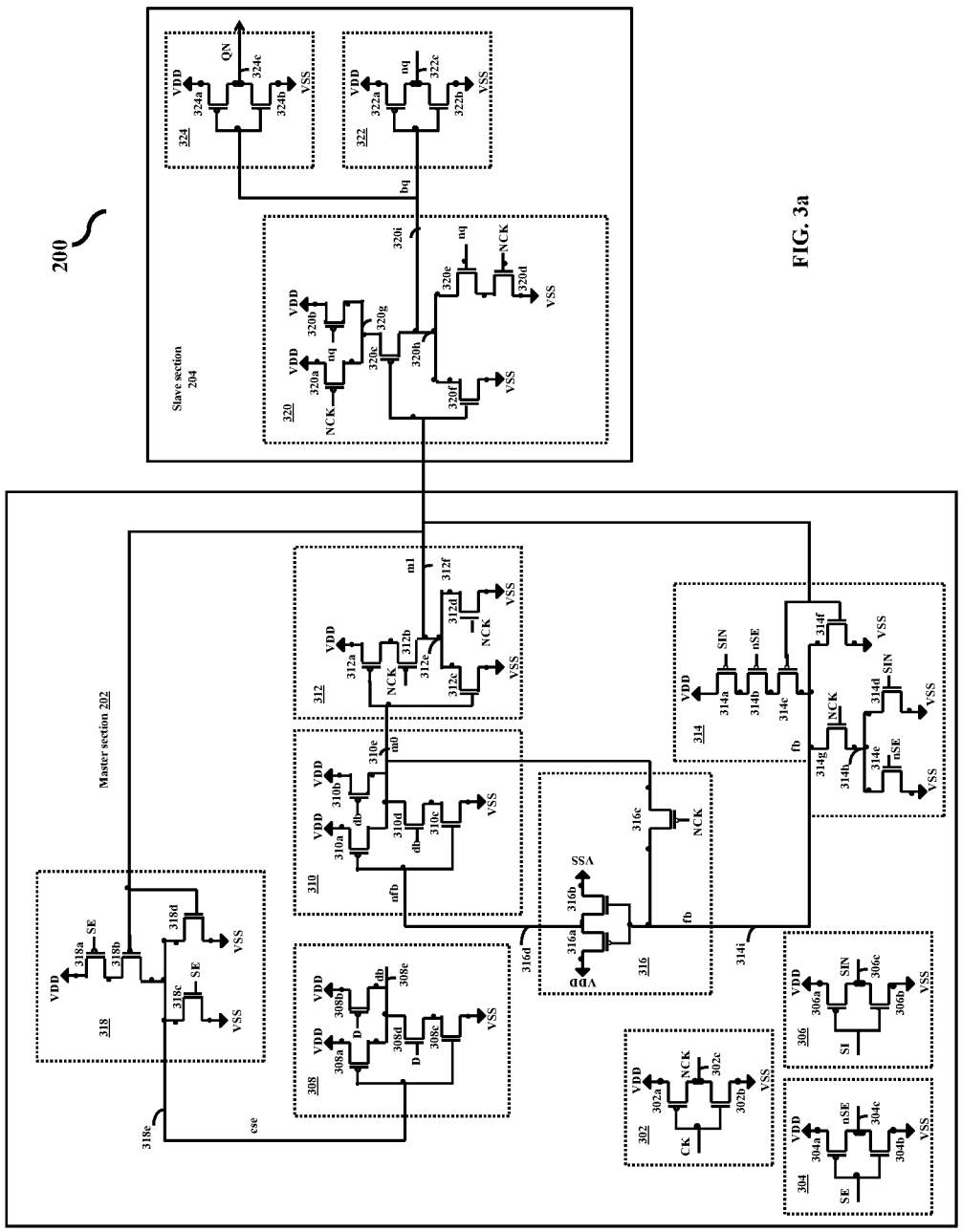
FIG. 3a is a circuit diagram depicting components of the flip-flop, according to embodiments as disclosed herein.

FIG. 3a is a circuit diagram depicting components of the flip-flop 200, according to embodiments as disclosed herein. The flip-flop 200 includes the master section 202 and the slave section 204.

The master section 202 can be configured to receive the data input D, the scan input signal SI, the scan enable signal SE, and the clock signal CK, and to generate a master output signal m1. The master section 202 includes a first master sub-section 302, a second master sub-section 304, a third master sub-section 306, a fourth master sub-section 308, a fifth master sub-section 310, a sixth master sub-section 312, a seventh master sub-section 314, an eighth sub-section 316, and a ninth master sub-section 318 for generating the master output signal m1. The master output signal m1 may be generated depending on the latching of at least one of the inputs (the data input or the scan input signal SI) or retaining of the previous latched input. The seventh, eighth, and ninth master sub-sections (314-318) form a feedback path in the master section 202. The master sub-sections 302-318 may include one or more P-type metal-oxide-semiconductor (PMOS) transistors, and one or more N-type metal-oxide-semiconductor (NMOS) transistors for performing at least one intended function. The PMOS transistors of the master sub-sections 302-318 may maintain a body bias voltage of VNW to minimize leakages that can be caused due to parasitic elements (i.e., parasitic formation). The VNW can be high supply voltage or an active high signal 1. The NMOS transistors of the master sub-sections 302-318 may maintain a body bias voltage of VPW to reduce the parasitic formation. The VPW can be low supply voltage or an active low value of 0 (ground voltage).

In an embodiment, a negative clock signal NCK can be applied to the sub-sections 312-318 for performing the at least one intended function, which reduces a setup time (an amount of time the data input has to remain stable before an arrival of an edge of the clock signal CK) of the flip-flop 200. In an embodiment, the master output signal m1 may be reduced/discharged to zero for half of the phase of clock cycles. Thus, the flip-flop 200 may be referred as a pre-discharging based flip-flop with negative setup time. The master section 202 is individually depicted in FIG. 3b.

Figure 3B:
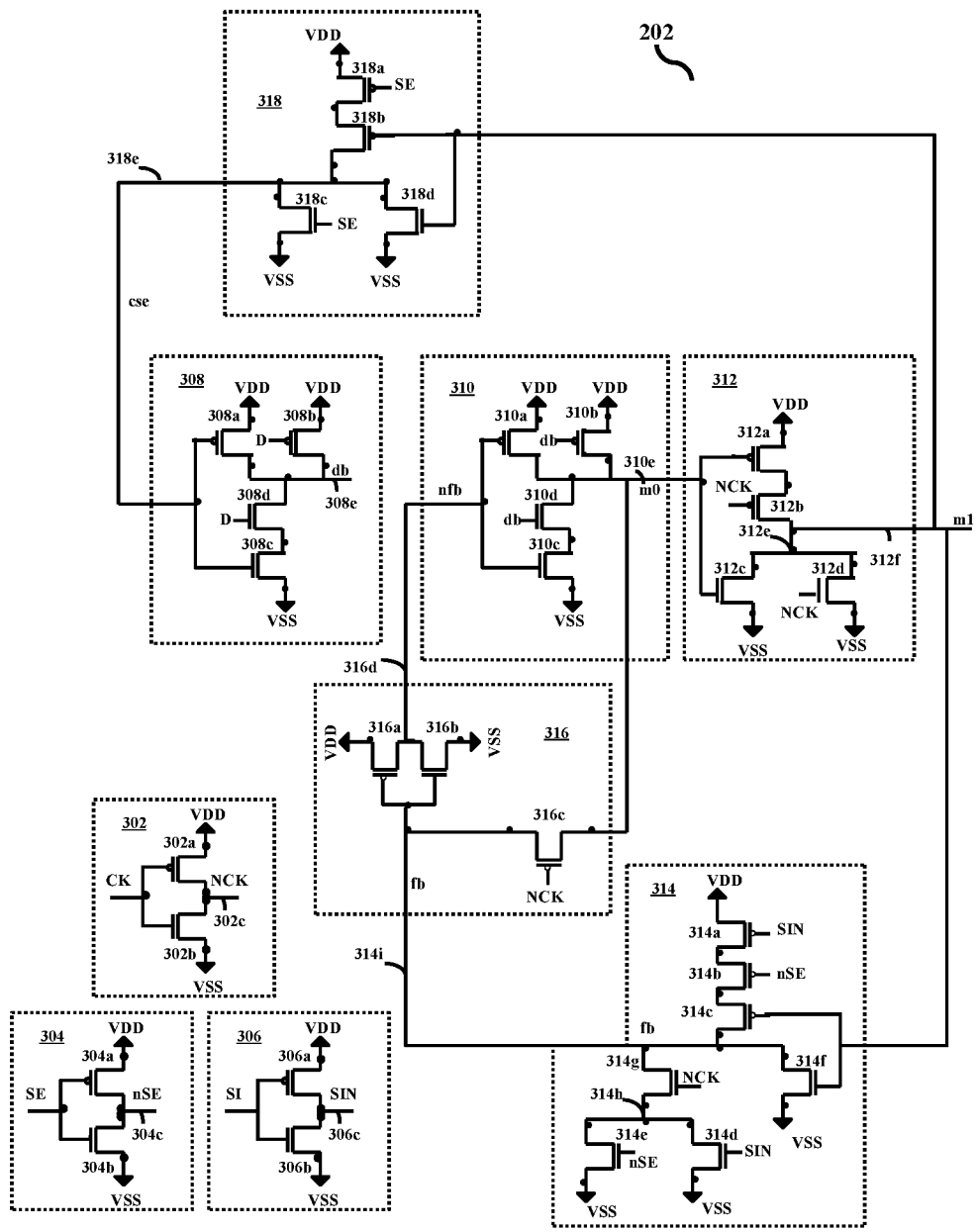
FIG. 3b is a circuit diagram depicting a master section of the flip-flop, according to embodiments as disclosed herein.

As depicted in FIGS. 3a, and 3b, the first master sub-section 302 can be configured to receive the clock signal CK and to output the inversion of the clock signal NCK on a first master sub-section output node 302c. The first master sub-section 302 can be an inverter, which performs an invert operation on the clock signal CK to output the inversion of the clock signal NCK. The first master sub-section 302 includes a first PMOS transistor 302a, and a first NMOS transistor 302b for outputting the inversion of the clock signal NCK on the first master sub-section output node 302c. The first PMOS transistor 302a may be connected to a VDD voltage (a high supply voltage), the clock signal CK, and the first master sub-section output node 302c. The first PMOS transistor 302a includes a source connected to the VDD voltage, a gate connected to the clock signal CK and a drain connected to the first master sub-section output node 302c. The first NMOS transistor 302b may be connected to a VSS voltage (a low supply voltage/ground), the clock signal, and the first master sub-section output node 302c. The first NMOS transistor 302b includes a source connected to the VSS voltage, a gate connected to the clock signal CK and a drain connected to the first master sub-section output node 302c. In an embodiment, when the clock signal CK=0 (the low logic level), the first PMOS transistor 302a operates/turns ON and outputs the inversion of the clock signal NCK=1 on the first master sub-section output node 302c. In an embodiment, when the clock signal CK=1 (the high logic level), the first NMOS transistor 302b turns ON and outputs the inversion of the clock signal NCK=0 on the first master sub-section output node 302c.

The second master sub-section 304 can be configured to receive the scan enable signal SE and to output an inversion of the scan enable signal nSE on a second master sub-section output node 304c. The second master sub-section 304 can be an inverter, which performs an invert operation on the scan enable signal SE to output the inversion of the scan enable signal nSE. The second master sub-section 304 includes a second PMOS transistor 304a and a second NMOS transistor 304b for outputting the inversion of the scan enable signal nSE on the second master sub-section output node 304c. The second PMOS transistor 304a may be connected to the VDD voltage, the scan enable signal SE, and the second master sub-section output node 304c. The second PMOS transistor 304a includes a source connected to the VDD voltage, a gate connected to the scan enable signal SE and a drain connected to the second master sub-section output node 304c. The second NMOS transistor 304b may be connected to the VSS voltage, the scan enable signal SE, and the second master sub-section output node 304c. The second NMOS transistor 304b includes a source connected to the VSS voltage, a gate connected to the scan enable signal SE and a drain connected to the second master sub-section output node 304c. In an embodiment, when the scan enable signal SE=0, the second PMOS transistor 304a turns ON and outputs the inversion of the clock scan enable signal nSE=1 on the second master sub-section output node 304c. In an embodiment, when the scan enable signal SE=1, the second NMOS transistor 304b turns ON and outputs the inversion of the scan enable signal nSE=0 on the second master sub-section output node 304c.

The third master sub-section 306 can be configured to receive the scan input signal SI and to output an inversion of the scan input signal SIN on a third master sub-section output node 306c. The third master sub-section 306 can be an inverter, which performs an invert operation on the scan input signal SI to output an inversion of the scan input signal SIN. The third master sub-section 306 includes a third PMOS transistor 306a and a third NMOS transistor 306b for outputting the inversion of the scan input signal SIN on the third master sub-section output node 306c. The third PMOS transistor 306a may be connected to the VDD voltage, the scan input signal, and the third master sub-section output node 306c. The third PMOS transistor 306a includes a source connected to the VDD voltage, a gate connected to the scan input signal SI and a drain connected to the third master sub-section output node 306c. The third NMOS transistor 306b may be connected to the VSS voltage and the third master sub-section output node 306c. The third NMOS transistor 306b includes a source connected to the VSS voltage, a gate connected to the scan input signal SI and a drain connected to the third master sub-section output node 306c. In an embodiment, when the scan input signal SI=0, the third PMOS transistor 306a turns ON and outputs the inversion of the scan input signal SIN=1 on the third master sub-section output node 306c. In an embodiment, when the scan input signal SI=1, the third NMOS transistor 306b turns ON and outputs the inversion of the scan input signal SIN=0 on the third master sub-section output node 306c.

The fourth master sub-section 308 can be configured to receive the data input D and an internal control signal cse from the ninth master sub-section 318 (that is present on the feedback path) and to output a inverted data signal db on a fourth master sub-section output node 308e. The fourth master sub-section 308 can be a NAND circuit, which outputs the inverted data signal db by performing a NAND operation on the data input D and the internal control signal cse. The fourth master sub-section 308 includes a fourth PMOS transistor 308a, a fifth PMOS transistor 308b, a fourth NMOS transistor 308c, and a fifth NMOS transistor 308d for outputting the inverted data signal db on the fourth master sub-section output node 308e. The fourth PMOS transistor 308a may be connected to the VDD voltage, the internal control signal cse outputted on a ninth master sub-section output node 318e, and the fourth master sub-section output node 308e. The fifth PMOS transistor 308b can be connected to the VDD voltage, the data input D, and the fourth master sub-section output node 308e. The fourth PMOS transistor 308a includes a source connected to the VDD voltage, a gate connected to the internal control signal cse, and a drain connected to the fourth master sub-section output node 308e. The fifth PMOS transistor 308b includes a source connected to the VDD voltage, a gate connected to the data input D, and a drain connected to the fourth master sub-section output node 308e. The fourth NMOS transistor 308c can be connected to the VSS voltage, the fifth NMOS transistor 308d, and the internal control signal cse. The fifth NMOS transistor 308d can be connected to the data input D, and the fourth master sub-section output node 308e. The fourth NMOS transistor 308c includes a source connected to the VSS voltage, a gate connected to the internal control signal cse, and a drain connected to a source of the fifth NMOS transistor 308d. The fifth NMOS transistor 308d includes a gate connected to the data input D, and a drain connected to the fourth master sub-section output node 308e.

In an embodiment, when the data input D=1, and the internal control signal cse=1, the fourth and fifth NMOS transistors (308c, 308d) turn ON and output the inverted data signal db=0 on the fourth master sub-section output node 308e. In an embodiment, when the data input D=0, and/or the internal control signal cse=0, the fourth and fifth PMOS transistors (308a, 308b) turn ON and output the inverted data signal db=1 on the fourth master sub-section output node 308e.

The fifth master sub-section 310 can be configured to receive the inverted data signal db from the fourth master sub-section 308 and a master feedback signal nfb from the eighth master sub-section 316 (that is present on the feedback path) and to output an internal master signal m0 on a fifth master sub-section output node 310e. A value of the internal master signal m0 may correspond to the value of the data input D or the scan input signal SI, when the clock signal CK=0. Thus, the master section 204 may store/latch the at least one input (the data input D or the scan input signal SI) by storing the value of the at least one input in the internal master signal m0, when the clock signal CK=0. The value of the internal master signal m0 may correspond to a previous value of the internal master signal m0 (i.e., the value of the previous latched input), when the clock signal CK=1. Thus, the master section 204 may retain the previous latched input, when the clock signal CK=1.

The fifth master sub-section 310 can be a NAND circuit, which performs a NAND operation on the inverted data signal db, and the master feedback signal nfb to output the internal master signal m0 on the fifth master sub-section output node 310e. The fifth master sub-section 310 includes a sixth PMOS transistor 310a, a seventh PMOS transistor 310b, a sixth NMOS transistor 310c, and a seventh NMOS transistor 310d. The sixth PMOS transistor 310a can be connected to the VDD voltage, the master feedback signal nfb outputted on a eighth master sub-section output node 316d, and the fifth master sub-section output node 310e. The seventh PMOS transistor 310b can be connected to the VDD voltage, the inverted data signal db outputted on the fourth master sub-section output node 308e, and the fifth master sub-section output node 310e. The sixth PMOS transistor 310a includes a source connected to the VDD voltage, a gate connected to the master feedback signal nfb, and a drain connected to the fifth master sub-section output node 310e. The seventh PMOS transistor 310b includes a source connected to the VDD voltage, a gate connected to the inverted data signal db, and a drain connected to the fifth master sub-section output node 310e.

The sixth NMOS transistor 310c can be connected to the VSS voltage, the master feedback signal nfb, and the seventh NMOS transistor 310d. The seventh NMOS transistor 310d can be connected to the inverted data signal db outputted on the fourth master sub-section output node 308e, and the fifth master sub-section output node 310e. The sixth NMOS transistor 310c includes a source connected to the VSS voltage, a gate connected to the master feedback signal nfb, and a drain connected to a source of the seventh NMOS transistor 310d. The seventh NMOS transistor 310d includes a gate connected to the inverted data signal db, and a drain connected to the fifth master sub-section output node 310e.

In an embodiment, when the inverted data signal db=1, and the master feedback signal nfb=1, the sixth and seventh NMOS transistors (310c, 310d) turn ON and output the internal master signal m0=0 on the fifth master sub-section output node 310e. In an embodiment, when the inverted data signal db=0, and/or the master feedback signal nfb=0, the sixth and seventh PMOS transistors (310a, 310b) turn ON and output the internal master signal m0=1 on the fifth master sub-section output node 310e.

The sixth master sub-section 312 can be configured to receive the internal master signal m0 from the fifth master sub-section 310, and the inversion of the clock signal NCK from the first master sub-section 302 and to generate the master output signal m1 on the sixth master sub-section output node 312f. The sixth master sub-section 312 can be a NOR circuit, which performs a NOR operation on the internal signal m0 and the inversion of the clock signal NCK to generate the master output signal m1 on the sixth master sub-section output node 312f.

The sixth master sub-section 312 includes a eighth PMOS transistor 312a, a ninth PMOS transistor 312b, a eighth NMOS transistor 312c, and a ninth NMOS transistor 312d for generating the master output signal m1 on the sixth master sub-section output node 312f. The eighth PMOS transistor 312a can be connected to VDD voltage, the internal master signal m0 outputted on the fifth master sub-section output node 310e, and the ninth PMOS transistor 312b. The ninth PMOS transistor 312b can be connected to the inversion of the clock signal NCK outputted on the first master sub-section output node 302c, and the sixth master sub-section output node 312f. The eighth PMOS transistor 312a includes a source connected to the VDD voltage, a gate connected to the internal master signal m0, and a drain connected to a source of the ninth PMOS transistor 312b. The ninth PMOS transistor 312b includes a gate connected to the inversion of the clock signal NCK and a drain connected to the sixth master sub-section output node 312f.

The eighth NMOS transistor 312c can be connected to the VSS voltage, the internal master signal m0 outputted on the fifth master sub-section output node 310e, and a first conjunction node 312e. The first conjunction mode 312e can be connected to the sixth master sub-section output node 312f. The ninth NMOS transistor 312d can be connected to the VSS voltage, the inversion of the clock signal NCK, and the first conjunction node 312e. The eighth NMOS transistor 312c includes a source connected to the VSS voltage, a gate connected to the internal master signal m0, and a drain connected to the first conjunction node 312e. The ninth NMOS transistor 312d includes a source connected to the VSS voltage, a gate connected to the inversion of the clock signal NCK, and a drain connected to the first conjunction node 312e. The ninth NMOS transistor 312d discharges the master output signal to zero for half of the phase of the clock signal (i.e., the clock signal CK=0, and the inversion of the clock signal NCK=1).

In an embodiment, when the internal master signal m0=0, and the inversion of the clock signal NCK=0, the eighth and ninth PMOS transistors (312a, 312b) turn ON and generate the master output signal m1=1 on the sixth master sub-section output node 312f. In an embodiment, when the internal master signal m0=1 and/or the inversion of the clock signal NCK=1, the eighth and ninth NMOS transistors (312c, 312d) turn ON and generate the master output signal m1=0 on the sixth master sub-section output node 312f. In an embodiment, the master output signal m1 may be discharged to zero for the half of the phase of the clock cycle.

The seventh master sub-section 314 can be configured to receive the inversion of the clock signal NCK, the inversion of the scan enable signal nSE, the inversion of the scan input signal SI, and the master output signal m1 from the first, second, third and sixth master sub-sections (302, 304, 306, and 312) respectively and to output a scan and clock mixing signal fb on a seventh master sub-section output node 314i. The seventh master sub-section 314 can be a scan and clock mixing circuit, which outputs the scan and clock mixing signal fb as a complex function of the inversion of the clock signal NCK, the inversion of the scan enable signal nSE, the inversion of the scan input signal SIN, and the master output signal m1. The seventh master sub-section 314 includes a tenth PMOS transistor 314a, a eleventh PMOS transistor 314b, a twelfth PMOS transistor 314c, a tenth NMOS transistor 314d, a eleventh NMOS transistor 314e, a twelfth NMOS transistor 314f, and a thirteenth NMOS transistor 314g for outputting the scan and clock mixing signal fb on the seventh master sub-section output node 314i.

The tenth PMOS transistor 314a can be connected to the VDD voltage, the inversion of the scan input signal SIN outputted on the third master sub-section output node 306c and the eleventh PMOS transistor 314b. The eleventh PMOS transistor 314b can be connected to the twelfth PMOS transistor 314c and the inversion of the scan enable signal nSE outputted on the second master sub-section output node 304c. The twelfth PMOS transistor 314c can be connected to the master output signal m1 outputted on the sixth master sub-section output node 312f, and the seventh master sub-section output node 314i. The tenth PMOS transistor 314a includes a source connected to the VDD voltage, a gate connected to the inversion of the scan input signal SIN, and a drain connected to a source of the eleventh PMOS transistor 314b. The eleventh PMOS transistor 314b includes a gate connected to the inversion of the scan enable signal nSE, and a drain connected to a source of the twelfth PMOS transistor 314c. The twelfth PMOS transistor 314c includes a gate connected to the master output signal m1, and a drain connected to the seventh master sub-section output node 314i.

The tenth NMOS transistor 314d can be connected to the VSS voltage, the inversion of the scan input signal SIN outputted on the third master sub-section output node 306c, and a second conjunction node 314h. The eleventh NMOS transistor 314e can be connected to the VSS voltage, the inversion of the scan enable signal nSE outputted on the second master sub-section output node 304c, and the second conjunction node 314h. The twelfth NMOS transistor 314f can be connected to the VSS voltage, the master output signal m1 outputted on the sixth master sub-section output node 312f, and the seventh master sub-section output node 314i. The thirteenth NMOS transistor 314g can be connected to the second conjunction node 314h, the inversion of the clock signal NCK outputted on the first master sub-section output node 302c, and the seventh master sub-section output node 314i. The tenth NMOS transistor 314d includes a source connected to the VSS voltage, a gate connected to the inversion of the scan input signal SIN, and a drain connected to the second conjunction node 314h. The eleventh NMOS transistor 314e includes a source connected to the VSS voltage, a gate connected to the inversion of the scan enable signal nSE, and a drain connected to the second conjunction node 314h. The twelfth NMOS transistor 314f includes a source connected to the VSS voltage, a gate connected to the master output signal m1, and a drain connected to the seventh master sub-section output node 314i. The thirteenth NMOS transistor 314g includes a source connected to the second conjunction node 314h, a gate connected to the inversion of the clock signal NCK, and a drain connected to the seventh master sub-section output node 314i.

In an embodiment, when the master output signal m1=1, the twelfth NMOS transistor 314f turns ON and outputs the scan and clock mixing signal fb=0 on the seventh master sub-section output node 314i. In an embodiment, when the inversion of the clock signal NCK=1, and the inversion of the scan enable signal nSE=1, the thirteen NMOS transistor 314g and the eleventh NMOS transistor 314e turn ON and output the scan and clock mixing signal fb=0 on the seventh master sub-section output node 314i. In an embodiment, when the inversion of the clock signal NCK=1, and the inversion of the scan input signal SIN=1, the thirteen NMOS transistor 314g, and the tenth NMOS transistor 314d turn ON and output the scan and clock mixing signal fb=0 on the seventh master sub-section output node 314i. In an embodiment, when the master output signal m1=0, and the inversion of the scan input signal SIN=0, and the inversion of the scan enable signal nSE=0, the tenth, eleventh, and twelfth PMOS transistors (314a, 314b, 314c) turn ON and output the scan and clock mixing signal fb=1 on the seventh master sub-section output node 314i. In an embodiment, when the master output signal m1=0, and the inversion of the scan input signal SIN=1 and the inversion of the scan enable signal nSE=1, and the inversion of the clock signal NCK=0, the twelfth PMOS transistor 314c, and the tenth and eleventh NMOS transistors (314d, 314e) turn ON. However, the tenth and eleventh PMOS transistors (314a, 314b), and the twelfth and thirteenth NMOS transistors (314f, 314g) may not turn ON. Thus, the scan and clock mixing signal fb may not be connected to the eighth master sub-section 316. In such a case, the eighth master sub-section 316 itself generates the scan and clock mixing signal fb.

The eighth master sub-section 316 can be configured to receive the scan and clock mixing signal fb from the seventh master sub-section 314 and to output the master feedback signal nfb on the eighth master sub-section output node 316d. The eighth master sub-section 316 can be a master feedback block, which performs an invert operation on the scan and clock mixing signal fb to output the master feedback signal nfb on the eighth master sub-section output node 316d. The eighth master sub-section 316 includes a thirteenth PMOS transistor 316a, and a fourteenth NMOS transistor 316b. The thirteenth PMOS transistor 316a can be connected to the VDD voltage, the scan and clock mixing signal fb outputted on the seventh master sub-section output node 314i, and the eighth master sub-section output node 316d. The thirteenth PMOS transistor 316a includes a source connected to the VDD voltage, a gate connected to the scan and clock mixing signal fb, and a drain connected to the eighth master sub-section output node 316d. The fourteenth NMOS transistor 316b can be connected to the VSS voltage, the scan and clock mixing signal fb outputted on the seventh master sub-section output node 314i, and the eighth master sub-section output node 316d. The fourteenth NMOS transistor 316b includes a source connected to the VSS voltage, a gate connected to the scan and clock mixing signal fb, and a drain connected to the eighth master sub-section output node 316d. In an embodiment, when the scan and clock mixing signal fb=1, the fourteenth NMOS transistor 316b turns ON and outputs the master feedback signal nfb=0 on the eighth master sub-section output node 316d. In an embodiment, when the scan and clock mixing signal fb=0, the thirteenth PMOS transistor 316a turns ON and outputs the master feedback signal nfb=1 on the eighth master sub-section output node 316d.

In an embodiment, the eighth master sub-section 316 also includes a fourteenth PMOS transistor 316c to output the scan and clock mixing signal fb, when the scan and clock mixing signal fb of the seventh master sub-section 314 has not been connected to the eighth master sub-section 316 (i.e., when the master output signal m1=0, and the inversion of the scan input signal SIN=1 and the inversion of the scan enable signal nSE=1, and the inversion of the clock signal NCK=0). The fourteenth PMOS transistor 316c can be connected to the internal master signal m0 outputted on the fifth master sub-section output node 310e, the inversion of the clock signal NCK, and the seventh master sub-section output node 314i. The fourteenth PMOS transistor 316c includes a source connected to the internal master signal m0, a gate connected to the inversion of the clock signal NCK, and a drain connected to the seventh master sub-section output node 314i. In an embodiment, when the internal master signal m0=1, and the inversion of the clock signal NCK=0, the fourteenth PMOS transistor 316c turns ON and outputs scan and clock mixing signal fb=1 on the seventh master sub-section output node 314i.

The ninth master sub-section 318 can be configured to receive the master output signal m1 from the sixth master sub-section 312, and the scan enable signal SE and to output the internal control signal cse on the ninth master sub-section output node 318e. The ninth master sub-section 318 performs a NOR operation on the master output signal m1 and the scan enable signal SE to output the internal control signal cse on the master sub-section output node 318e. The ninth master sub-section 318 includes a fifteenth PMOS transistor 318a, a sixteenth PMOS transistor 318b, a fifteenth NMOS transistor 318c, and a sixteenth NMOS transistor 318d. The fifteenth PMOS transistor 318a can be connected to the VDD voltage, the scan enable signal SE, and the sixteenth PMOS transistor 318b. The sixteenth PMOS transistor 318b can be connected to the master output signal m1 outputted on the sixth master sub-section output node 312f. The fifteenth PMOS transistor 318a includes a source connected to the VDD voltage, a gate connected to the scan enable signal SE, and a drain connected to a source of the sixteenth PMOS transistor 318b. The sixteenth PMOS transistor 318b includes a gate connected to the master output signal m1, and a drain connected to the ninth master sub-section output node 318e.

The fifteenth NMOS transistor 318c can be connected to the VSS voltage, the scan enable signal SE, and the ninth master sub-section output node 318e. The sixteenth NMOS transistor 318d can be connected to the VSS voltage, the master output signal m1 outputted on the sixth master sub-section output node 312f, and the ninth master sub-section output node 318e. The fifteenth NMOS transistor 318c includes a source connected to the VSS voltage, a gate connected to the scan enable signal SE, and the drain connected to the ninth master sub-section output node 318e. The sixteenth NMOS transistor 318d includes a source connected to the VSS voltage, a gate connected to the gate connected to the master output signal m1, and a drain connected to the ninth master sub-section output node 318e.

In an embodiment, when the master output signal m1=0, and the scan enable signal SE=0, the fifteenth and sixteenth PMOS transistors (318a, 318b) turn ON and output the internal control signal cse=1 on the ninth master sub-section output node 318e. In an embodiment, when the master output signal m1=1, and/or the scan enable signal SE=1, the fifteenth and sixteenth NMOS transistors (318c, 318d) turn ON and output the internal control signal cse=0 on the ninth master sub-section output node 318e.

The slave section 204 can be configured to receive the master output signal m1 from the master section 202 and provides the inverted output QN. The slave section 204 includes a first slave sub-section 320, a second slave sub-section 322, and a third slave sub-section 324 for providing the inverted output QN. The second slave sub-section 322 may present on a feedback path in the slave section 204. The slave sub-sections 320-324 may include one or more PMOS transistors and one or more NMOS transistors for performing at least one intended function. The one or more PMOS transistors of the slave sub-sections 320-324 may maintain body bias voltage of the VNW (the high supply voltage or active high signal 1) to minimize the leakage due to the parasitic formation. The one or more NMOS transistors of the slave sub-sections 320-324 may maintain body bias voltage of the VPW (the low supply voltage or low value signal of 0) to minimize the leakage due to the parasitic formation. In an embodiment, the sub-sections of the slave section 204 may be optimized to reduce delay between the clock signal NCK and the inverted output QN. The slave section 204 is individually depicted in FIG. 3c.

Figure 3C:
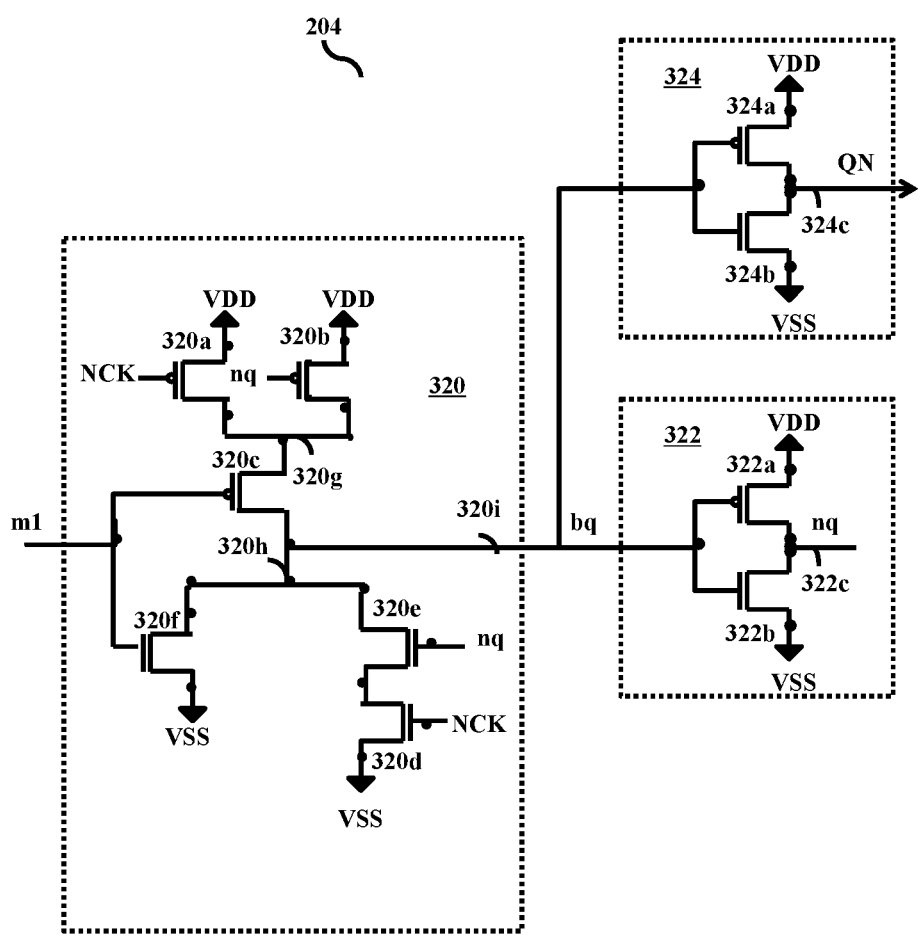
FIG. 3c is a circuit diagram depicting a slave section of the flip-flop, according to embodiments as disclosed herein.

As depicted in FIGS. 3a, and 3c, the first slave sub-section 320 can be configured to receive the master output signal m1 from the sixth master sub-section 312 of the master section 202, the inversion of the clock signal NCK from the first master sub-section 302, and a slave feedback signal nq from the second slave sub-section 322, and to output an internal Boolean signal bq on a first slave sub-section output node 320i. The first slave sub-section 320 performs a complex AND-OR invert operation on the master output signal m1, the inversion of the clock signal NCK, and the slave feedback signal nq to output the internal Boolean signal bq on the first slave sub-section output node 320i. The internal Boolean signal bq can be outputted using the below relation:

$$bq=NOT(nq.NCK+m1)$$

The first slave sub-section 320 includes a seventeenth PMOS transistor 320a, a eighteenth PMOS transistor 320b, a nineteenth PMOS transistor 320c, a seventeenth NMOS transistor 320d, a eighteenth NMOS transistor 320e, and a nineteenth PMOS transistor 320f.

The seventeenth PMOS transistor 320a can be connected to the VDD voltage, the inversion of the clock signal NCK outputted on the first master sub-section output node 302c, and a third conjunction node 320g. The eighteenth PMOS transistor 320b can be connected to the VDD voltage, the slave feedback signal nq outputted on a second slave sub-section output node 322c. The nineteenth PMOS transistor 320c can be connected to the third conjunction node 320g, the master output signal m1 outputted on the sixth master sub-section output node 312f, and the first slave sub-section output node 320i. The seventeenth PMOS transistor 320a includes a source connected to the VDD voltage, a gate connected to the inversion of the clock signal NCK, and the drain connected to the third conjunction node 320g. The eighteenth PMOS transistor 320b includes a source connected to the VDD voltage, a gate connected to the slave feedback signal nq, and a drain connected to the third conjunction node 320g. The nineteenth PMOS transistor 320c includes a source connected to the third conjunction node 320g, a gate connected to the master output signal m1, and a drain connected to the first slave sub-section output node 320i.

The seventeenth NMOS transistor 320d can be connected to the VSS voltage, the inversion of the clock signal NCK outputted on the first master sub-section output node 302c, and the eighteenth NMOS transistor 320e. The eighteenth NMOS transistor 320e can be connected to the slave feedback signal nq outputted on the second slave sub-section output node 320c, and a fourth conjunction node 320h. The fourth conjunction node 320h can be connected to the first slave sub-section output node 320i. The nineteenth NMOS transistor 320f can be connected to the VSS voltage, the master output signal m1 outputted on the sixth master sub-section output node 312f, and the fourth conjunction node 320h. The seventeenth NMOS transistor 320d includes a source connected to the VSS voltage, a gate connected to the inversion of the clock signal NCK, and a drain connected to a source of the eighteenth NMOS transistor 320e. The eighteenth NMOS transistor 320e includes a gate connected to the slave feedback signal nq, and a drain connected to the fourth conjunction node 320h. The nineteenth NMOS transistor 320f includes a source connected to the VSS voltage, a gate connected to the master output signal m1, and a drain connected to the fourth conjunction node 320h.

In an embodiment, when the slave feedback signal nq=1, the inversion of the clock signal NCK=1, the seventeenth and eighteenth NMOS transistors (320d, 320e) turn ON and output the internal Boolean signal bq=0 on the first slave sub-section output node 320i. In an embodiment, when the master output signal m1=1, the nineteenth NMOS transistor 320f turns ON and outputs the internal Boolean signal bq=0 on the first slave sub-section output node 320i. In an embodiment, when the master output signal m1=0, the slave feedback signal nq=0, the eighteenth and nineteenth PMOS transistors (320b, 320c) turn ON and output the internal Boolean signal bq=1 on the first slave sub-section output node 320i. In an embodiment, when the master output signal m1=0, and the inversion of the clock signal NCK=0, the nineteenth and seventeenth NMOS transistors (320c, 320a) turn ON and output the internal Boolean signal bq=1 on the first slave sub-section output node 320i.

The second slave sub-section 322 can be configured to receive the internal Boolean signal bq from the first slave sub-section 320 and to output the slave feedback signal nq on the second slave sub-section output node 322c. The second slave sub-section 322 performs an invert operation on the internal Boolean signal bq to output the slave feedback signal nq on the second slave sub-section output node 322c. The second slave sub-section 322 includes a twentieth PMOS transistor 322a, and a twentieth NMOS transistor 322b. The twentieth PMOS transistor 322a can be connected to the VDD voltage, the internal Boolean signal bq outputted on the first slave sub-section output node 320i, and the second slave sub-section output node 322c. The twentieth PMOS transistor 322a includes a source connected to the VDD voltage, a gate connected to the internal Boolean signal bq, and a drain connected to the second slave sub-section output node 322c. The twentieth NMOS transistor 322b can be connected to the VSS voltage, the internal Boolean signal bq outputted on the first slave sub-section output node 320i, and the second slave sub-section output node 322c. The twentieth NMOS transistor 322b includes a source connected to the VSS voltage, a gate connected to the internal Boolean signal bq, and a drain connected to the second slave sub-section output node 322c. In an embodiment, when the internal Boolean signal bq=0, the twentieth PMOS transistor 322a turns ON and outputs the slave feedback signal nq=1 on the second slave sub-section output node 322c. In an embodiment, when the internal Boolean signal bq=1, the twentieth NMOS transistor 322b turns ON and outputs the slave feedback signal nq=0 on the second slave sub-section output node 322c.

The third slave sub-section 324 can be configured to receive the internal Boolean signal bq from the first slave sub-section 322, and to provide the inverted output QN on an output node 324c. The third slave sub-section 324 can be an output QN inverter block, which performs an invert operation on the internal Boolean signal bq to provide the inverted output QN on the output node 324c. The inverted output QN may correspond to its previous value, when the clock signal CK=0. The inverted output QN may correspond to the inversion of the latched input by the master section 202 (i.e., during the clock signal CK=0), when the clock signal CK=1.

The third slave sub-section 324 includes a twenty-first PMOS transistor 324a, and a twenty-first NMOS transistor 324b. The twenty-first PMOS transistor 324a can be connected to the VDD voltage, the internal Boolean signal bq outputted on the first slave sub-section output node 320i, and the output node 324c. The twenty-first PMOS transistor 322a includes a source connected to the VDD voltage, a gate connected to the internal Boolean signal bq, and a drain connected to the output node 324c. The twenty-first NMOS transistor 324b can be connected to the VSS voltage, the internal Boolean signal bq outputted on the first slave sub-section output node 320i, and the output node 324c. The twenty-first NMOS transistor 324b includes a source connected to the VSS voltage, a gate connected to the internal Boolean signal bq, and a drain connected to the output node 324c. In an embodiment, when the internal Boolean signal bq=0, the twenty-first PMOS transistor 324a turns ON and provides the inverted output QN=1 on the output node 324c. In an embodiment, when the internal Boolean signal bq=1, the twenty-first NMOS transistor 324b turns ON and provides the inverted output QN=0 on the output node 324c.

Embodiments herein enable the flip-flop 200 to operate in the normal mode of operation, when the flip-flop 200 receives the scan enable signal SE=0. In such a case, the flip-flop 200 receives the data input D and provides the inverted output QN as QN=NOT (D).

Consider an example herein, wherein the data input D=0 may be provided as an input to the flip-flop 200 during the normal mode of operation and the previous value of the inverted output QN of the flip-flop 200 may be QN=0. In such a case, the master section 202 of the flip-flop 200 latches/stores the data input D and the slave section 204 of the flip-flop 200 retains its previous value of the inverted output QN=0, when the clock signal CK=0. The master section 202 retains the previous value of the latched data input D, and the slave section 204 obtains the latched data input D of the master section 202 and provides a new inverted output QN=1, (i.e, inversion/NOT(D)), when the clock signal CK=1 (at a positive edge of the clock signal).

When the scan enable signal SE=0, the data input D=0, and the clock signal CK=0, the first master sub-section 302 outputs the inversion of the clock signal NCK=1, and the second master sub-section 304 outputs the inversion of the scan enable signal nSE=1. As the inversion of the clock signal NCK=1, the sixth master sub-section 312 generates the master output signal m1=0. The ninth master sub-section 318 outputs the internal control signal cse=1, as the scan enable signal SE=0, and the master output signal m1=0. The seventh master section 314 outputs the scan and clock mixing signal fb=0, as the inversion of the clock signal NCK=1, and the inversion of the scan enable signal nSE=1. The eighth master section 316 outputs the master feedback signal nfb=1, as the scan and clock mixing signal fb=0. The fourth master section 308 outputs the inverted data signal db=1, as the internal control signal cse=1, and the data input D=0. The fifth master section 310 outputs the internal master signal m0=0=D, as the db=1, and the master feedback signal nfb=1. Thus, the master stores the value of the data input D in the internal master signal m0, when the clock signal CK=0. The slave section 204 receives the inversion of the clock signal NCK=1 from the first master sub-section 302, and the master output signal m1=0 from the sixth master sub-section 312, and retains the previous value of the inverted output QN=0, when the clock signal CK=0. In an example herein, consider that the internal Boolean signal bq=1 may be present on the first slave sub-section output node 320i. In such a case, the second slave sub-section 322 outputs the slave feedback signal nq=0. The first slave sub-section 320 outputs the internal Boolean signal bq=1, as the slave feedback signal nq=0. The third slave sub-section provides the inverted output QN=0 (the previous value), as the master output signal m1=0, and the internal Boolean signal bq=1. Thus, the slave section 204 retains the previous value of the inverted output QN when the clock signal CK=0.

When the scan enable signal SE=0, the data input D=0, and the clock signal CK=1, the first master sub-section 302 outputs the inversion of the clock signal NCK=0. As the inversion of the clock signal NCK=0, and the internal master signal m0=0 (i.e., the value stored when the clock signal CK=0), the sixth master sub-section 312 generates the master output signal m1=1. The ninth master sub-section 318 outputs the internal control signal cse=0, as the master output signal m1=1. The fourth master sub-section 308 outputs the inverted data signal db=1, as the internal control signal cse=0. The seventh master section 314 outputs the scan and clock mixing signal fb=0, as the master output signal m1=1. The eighth master section 316 outputs the master feedback signal nfb=1, as the scan and clock mixing signal fb=0. The fifth master section 310 outputs the internal master signal m0=0 (the previous value of the stored data input D), as the inverted data signal db=1, and the master feedback signal nfb=1. Thus, the master retains the previous value of the internal master signal m0=0 (i.e., the previous value of the stored data input D). The first slave sub-section 320 of the slave section 204 outputs the internal Boolean signal bq=0, as the master output signal m1=1. The third slave sub-section provides the inverted output QN=1, as the internal Boolean signal bq=0. Thus, the inverted output QN provides the new value at the positive edge of the clock signal (i.e., when the clock signal CK=1) by receiving the latched/stored data input D of the master section 202 (i.e., by latching the internal master signal m0 of the master section 202). The inverted output QN may correspond to the inversion of the data input D.

Consider another example scenario, wherein the data input D=1 may be provided as an input to the flip-flop 200 during the normal mode of operation and the previous value of the inverted QN of the flip-flop 200 may be QN=1. In such a case, the master section 202 of the flip-flop 200 latches/stores the data input D=1 and the slave section 204 of the flip-flop 200 retains its previous value of the inverted output QN=1, when the clock signal CK=0. The master section 202 retains the previous value of the stored data input D=1, and the slave section 204 latches the value of the stored data input D by the master section 202 and provides a new inverted output QN=0 (i.e, inversion/NOT(D)), when the clock signal CK=1 (at the positive edge of the clock signal).

When the scan enable signal SE=0, the data input D=1, and the clock signal CK=0, the first master sub-section 302 outputs the inversion of the clock signal NCK=1, and the second master sub-section 304 outputs the inversion of the scan enable signal nSE=1. As the inversion of the clock signal NCK=1, the sixth master sub-section 312 generates the master output signal m1=0. The ninth master sub-section 318 outputs the internal control signal cse=1, as the scan enable signal SE=0, and the master output signal m1=0. The seventh master section 314 outputs the scan and clock mixing signal fb=0, as the inversion of the clock signal NCK=1, and the inversion of the scan enable signal nSE=1. The eighth master section 316 outputs the master feedback signal nfb=1, as the scan and clock mixing signal fb=0. The fourth master section 308 outputs the inverted data signal db=0, as the internal control signal cse=1, and the data input D=1. The fifth master section 310 outputs the internal master signal m0=1=D, as the inverted data signal db=0, and the master feedback signal nfb=1. Thus, the master stores the value of the data input D in the internal master signal m0. The slave section 204 receives the inversion of the clock signal NCK=1 from the first master sub-section 302, and the master output signal m1=0 from the sixth master sub-section 312, and retains the previous value of the inverted output QN=1, when the clock signal CK=0. In an example herein, consider that the internal Boolean signal bq=0 may be present on the first slave sub-section output node 320i. In such a case, the second slave sub-section 322 outputs the slave feedback signal nq=1. The first slave sub-section 320 outputs the internal Boolean signal bq=0, as the slave feedback signal nq=1. The third slave sub-section provides the inverted output QN=1 (the previous value), as the internal Boolean signal bq=0. Thus, the slave section 204 retains the previous value of the inverted output QN when the clock signal CK=0.

When the scan enable signal SE=0, the data input D=1, and the clock signal CK=1, the first master sub-section 302 outputs the inversion of the clock signal NCK=0. As the inversion of the clock signal NCK=0, and the internal master signal m0=1 (i.e., the value stored when the clock signal CK=0), the sixth master sub-section 312 generates the master output signal m1=0. The ninth master sub-section 318 outputs the internal control signal cse=1, as the master output signal m1=0, and the scan enable signal SE=0. The fourth master sub-section 308 outputs the inverted data signal db=0, as the internal control signal cse=1, and the data input D=1. As the master output signal m1=0, and the inversion of the clock signal NCK=0, the seventh master section 314 does not output the scan and clock mixing signal fb. In such a case, the eighth master section 316 outputs the scan and clock mixing signal fb=1, as the internal master signal m0=1, and the inversion of the clock signal NCK=0. The eighth master section 316 then outputs the master feedback signal nfb=0, as the scan and clock mixing signal fb=1. The fifth master section 310 outputs the internal master signal m0=1 (the previous value of the stored data input D), as the master feedback signal nfb=0. Thus, the master retains the previous value of the internal master signal m0=1, when the clock signal CK=1. The first slave sub-section 320 of the slave section 204 outputs the internal Boolean signal bq=1, as the master output signal m1=0, and the inversion of the clock signal NCK=0. The third slave sub-section provides the inverted output QN=0, as the internal Boolean signal bq=1. Thus, the inverted output QN=0 provides the new value at the positive edge of the clock signal (i.e., when the clock signal CK=1) by receiving the latched/stored data input D of the master section 202 (i.e., by latching the internal master signal m0 of the master section 202). The inverted output QN may correspond to the inversion of the data input D=1.

Embodiments herein enable the flip-flop 200 to operate in the scan mode on receiving the scan enable signal SE=1. In such a case, the flip-flop 200 receives the scan input signal SI and provides the inverted output QN as QN=NOT (SI).

Consider an example scenario, wherein the scan input signal SI=0 may be provided as an input to the flip-flop 200 during the scan mode of operation and the previous value of the inverted QN of the flip-flop 200 may be QN=0. In such a case, the master section 202 of the flip-flop 200 latches/stores the scan input signal SI and the slave section 204 of the flip-flop 200 retains its previous value of the inverted output QN=0, when the clock signal CK=0. The master section 202 retains the previous value of the stored scan input signal SI, and the slave section 204 latches the stored scan input signal SI of the master section 202 and provides a new inverted output QN=1, (i.e, inversion/NOT(SI)), when the clock signal CK=1 (at a positive edge of the clock signal).

When the scan enable signal SE=1, the scan input signal SI=0, and the clock signal CK=0, the first master sub-section 302 outputs the inversion of the clock signal NCK=1, the second master sub-section 304 outputs the inversion of the scan enable signal nSE=0, and the third master sub-section outputs the inversion of the scan input signal SIN=1. As the inversion of the clock signal NCK=1, the sixth master sub-section 312 generates the master output signal m1=0. The ninth master sub-section 318 outputs the internal control signal cse=0, as the scan enable signal SE=1. The seventh master section 314 outputs the scan and clock mixing signal fb=0, as the inversion of the clock signal NCK=1, and the inversion of the scan input signal SIN=1. The eighth master section 316 outputs the master feedback signal nfb=1, as the scan and clock mixing signal fb=0. The fourth master section 308 outputs the inverted data signal db=1, as the internal control signal cse=0. The fifth master section 310 outputs the internal master signal m0=0=SI, as the inverted data signal db=1, and the master feedback signal nfb=1. Thus, the master section 202 stores the value of the scan input signal SI in the internal master signal m0 irrespective of the value of the data input D. The slave section 204 receives the inversion of the clock signal NCK=1 from the first master sub-section 302, and the master output signal m1=0 from the sixth master sub-section 312, and retains the previous value of the inverted output QN=0, when the clock signal CK=0. In an example herein, consider that the internal Boolean signal bq=1 may be present on the first slave sub-section output node 320i. In such a case, the second slave sub-section 322 outputs the slave feedback signal nq=0. The first slave sub-section 320 outputs the internal Boolean signal bq=1, as the slave feedback signal nq=0. The third slave sub-section provides the inverted output QN=0 (the previous value), as the master output signal m1=0, and the internal Boolean signal bq=1. Thus, the slave section 204 retains the previous value of the inverted output QN when the clock signal CK=0.

Consider another example scenario, wherein the scan input signal SI=1 may be provided as an input to the flip-flop 200 and the previous value of the inverted QN of the flip-flop 200 may be QN=1 during the scan mode of operation. In such a case, the master section 202 of the flip-flop 200 latches/stores the scan input signal SI=1 and the slave section 204 of the flip-flop 200 retains its previous value of the inverted output QN=1, when the clock signal CK=0. The master section 202 retains the previous value of the stored scan input signal SI, and the slave section 204 latches the stored scan input signal SI of the master section 202 and provides a new inverted output QN=0, (i.e, inversion/NOT (SI)), when the clock signal CK=1 (at a positive edge of the clock signal).

When the scan enable signal SE=1, the scan input signal SI=1, and the clock signal CK=0, the first master sub-section 302 outputs the inversion of the clock signal NCK=1, the second master sub-section 304 outputs the inversion of the scan enable signal nSE=0, and the third master sub-section outputs the inversion of the scan input signal SIN=0. As the inversion of the clock signal NCK=1, the sixth master sub-section 312 generates the master output signal m1=0. The ninth master sub-section 318 outputs the internal control signal cse=0, as the scan enable signal SE=1. The seventh master section 314 outputs the scan and clock mixing signal fb=1, as the inversion of the scan enable signal nSE=1, and the inversion of the scan input signal SIN=0, and the inversion of the master output signal m1=0. The eighth master section 316 outputs the master feedback signal nfb=0, as the scan and clock mixing signal fb=1. The fourth master section 308 outputs the inverted data signal db=1, as the internal control signal cse=0. The fifth master section 310 outputs the internal master signal m0=1=SI, as the inverted data signal db=1, and the master feedback signal nfb=0. Thus, the master stores the value of the scan input signal SI in the internal master signal m0 irrespective of the value of the data input D. The slave section 204 receives the inversion of the clock signal NCK=1 from the first master sub-section 302, and the master output signal m1=0 from the sixth master sub-section 312, and retains the previous value of the inverted output QN=1, when the clock signal CK=0. In an example herein, consider that the internal Boolean signal bq=0 may be present on the first slave sub-section output node 320i. In such a case, the second slave sub-section 322 outputs the slave feedback signal nq=1. The first slave sub-section 320 outputs the internal Boolean signal bq=0, as the slave feedback signal nq=1. The third slave sub-section provides the inverted output QN=1 (the previous value), as the master output signal m1=0, and the internal Boolean signal bq=0. Thus, the slave section 204 retains the previous value of the inverted output QN when the clock signal CK=0.

Figure 4:
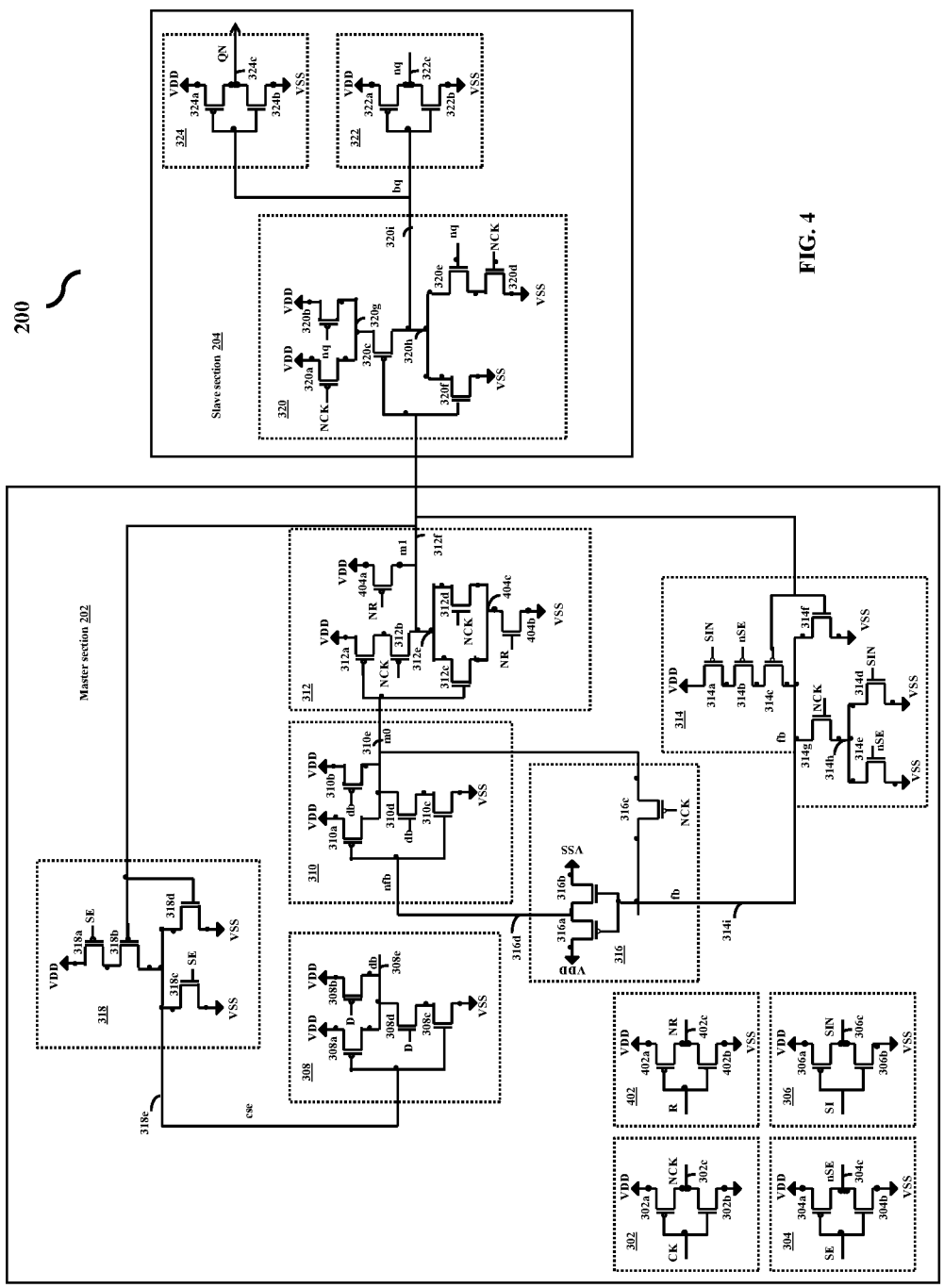
FIG. 4 depicts a circuit diagram depicting the flip-flop including a reset functionality, according to embodiments as disclosed herein.

FIG. 4 depicts a circuit diagram depicting the flip-flop 200 including a reset functionality, according to embodiments as disclosed herein. Embodiments herein enable the flip-flop 200 to perform a reset operation by including the reset functionality. In an embodiment, the reset functionality may be achieved by implementing four transistors in the master section 204. For example, the flip-flop 200 may perform the normal operation or the scan test operation if the reset control signal R has a logic low level (i.e., R=0). The flip-flop 200 may perform the reset operation if the reset control signal R has a logic high level (i.e., R=1).

The master section 202 of the flip-flop 200 can be configured to receive the data input D, the scan enable signal SE, the scan input signal SI, the clock signal CK, and the reset control signal and to generate the master output signal m1. In an embodiment, for achieving the reset functionality, the master section 202 includes the first-ninth sub-sections (302-318), and a tenth master sub-section 402.

The tenth master sub-section 402 can be configured to receive the reset control signal R and to output an inversion of the reset control signal NR on a tenth master sub-section output node 402c. The tenth master sub-section 402 can be an inverter, which performs an invert operation on the reset control signal R to output the inversion of the reset control signal NR. The tenth master sub-section 402 includes a twenty-second PMOS transistor 402a, and a twenty-second NMOS transistor 402b. The twenty-second PMOS transistor 402a can be connected to the VDD voltage, the reset control signal R, and the tenth master sub-section output node 402c. The twenty-second PMOS transistor 402a includes a source connected to the VDD voltage, a gate connected to the reset control signal, and a drain connected to the tenth master sub-section output node 402c. The twenty-second NMOS transistor 402b can be connected to the VSS voltage, the reset control signal R, and the tenth master sub-section output node 402c. The twenty-second NMOS transistor 402b includes a source connected to the VSS voltage, a gate connected to the reset control signal, and a drain connected to the tenth master sub-section output node 402c. In an embodiment, when the reset control signal R=0, the twenty-second PMOS transistor 402a turns ON and outputs the inversion of the reset control signal R=1 on the tenth master sub-section output node 402c. In an embodiment, when the reset control signal R=1, the twenty-second NMOS transistor 402b turns ON and outputs the inversion of the reset control signal R=0 on the tenth master sub-section output node 402c.

The first master sub-section 302 can be configured to perform the invert operation on the clock signal CK for outputting the inversion of the clock signal NCK on the first master sub-section output node 302c. The first master sub-section 302 includes the first PMOS transistor 302a, and the first NMOS transistor 302b for outputting the inversion of the clock signal NCK on the first master sub-section output node 302c. The second master sub-section 304 can be configured to perform the invert operation on the scan enable signal SE for outputting the inversion of the scan enable signal nSE on the second master sub-section output node 304c. The second master sub-section 304 includes the second PMOS transistor 304a, and the second NMOS transistor 304b for outputting the inversion of the scan enable signal nSE on the second master sub-section output node 304c. The third master sub-section 306 can be configured to perform the invert operation on the scan input signal SI for outputting the inversion of the scan input signal SIN on the third master sub-section output node 306c. The third master sub-section 306 includes the third PMOS transistor 306a, and the third NMOS transistor 306b for outputting the inversion of the scan input signal SIN on the third master sub-section output node 306c. The fourth master sub-section 308 can be configured to perform the NAND operation on the data input D, and the internal control signal cse for outputting the inverted data signal db on the fourth master sub-section output node 308e. The fourth master sub-section 308 includes the fourth PMOS transistor 308a, the fifth PMOS transistor 308b, the fourth NMOS transistor 308c, and the fifth NMOS transistor 308d for outputting the inverted data signal db on the fourth master sub-section output node 308e. The fifth master sub-section 310 can be configured to perform the NAND operation on the inverted data signal db, and the master feedback signal nfb for outputting the internal master signal m0 on the fifth master sub-section output node 310e. The fifth master sub-section 310 includes the sixth PMOS transistor 310a, the seventh PMOS transistor 310b, the sixth NMOS transistor 310c, and the seventh NMOS transistor 310d for outputting the internal master signal m0 on the fifth master sub-section output node 310e. The configurations of the transistors of the first, second, third, fourth, and fifth master sub-sections (302-310) and their intended functions are depicted in FIGS. 3a, and 3b.

The sixth master sub-section 312 can be configured to receive the internal master signal m0 from the fifth master sub-section 310, the inversion of the clock signal NCK from the first master sub-section 302 and the inversion of the reset control signal NR from the tenth master sub-section 402 and to generate the master output signal m1 on the sixth master sub-section output node 312f. The sixth master sub-section 312 includes the eighth PMOS transistor 312a, the ninth PMOS transistor 312b, a twenty-third PMOS transistor 404a, the eighth NMOS transistor 312c, the ninth NMOS transistor 312d, and a twenty-third NMOS transistor 404b for generating the master output signal m1 on the sixth master sub-section output node 312f. The eighth PMOS transistor 312a can be connected to VDD voltage, the internal master signal m0 outputted on the fifth master sub-section output node 310e, and the ninth PMOS transistor 312b. The ninth PMOS transistor 312b can be connected to the inversion of the clock signal NCK outputted on the first master sub-section output node 302c, and the sixth master sub-section output node 312f. The twenty-third PMOS transistor 404a can be connected to the VDD voltage, the inversion of the reset control signal NR outputted on the tenth master sub-section output node 402c, and the sixth master sub-section output node 312f. The eighth PMOS transistor 312a includes the source connected to the VDD voltage, the gate connected to the internal master signal m0, and the drain connected to a source of the ninth PMOS transistor 312b. The ninth PMOS transistor 312b includes the gate connected to the inversion of the clock signal NCK and the drain connected to the sixth master sub-section output node 312f. The twenty-third PMOS transistor 404a includes a source connected to the VDD voltage, a gate connected to inversion of the reset control signal NR, and a drain connected to the sixth master sub-section output node 312f.

The eighth NMOS transistor 312c can be connected to a fifth conjunction node 404c, the internal master signal m0 outputted on the fifth master sub-section output node 310e, and the first conjunction node 312e. The first conjunction mode 312e can be connected to the sixth master sub-section output node 312f. The ninth NMOS transistor 312d can be connected to the fifth conjunction node 404c, the inversion of the clock signal NCK, and the first conjunction node 312e. The twenty-third NMOS transistor 404b can be connected to the VSS voltage, the inversion of the reset control signal outputted on the tenth master sub-section output node 402c, and the fifth conjunction node 404c. The eighth NMOS transistor 312c includes the source connected to the fifth conjunction node 404c, the gate connected to the internal master signal m0, and the drain connected to the first conjunction node 312e. The ninth NMOS transistor 312d includes the source connected to the fifth conjunction node 404c, the gate connected to the inversion of the clock signal NCK, and the drain connected to the first conjunction node 312e. The twenty-third NMOS transistor 404b includes a source connected to VSS voltage, a gate connected to the inversion of the reset control signal NR, and a drain connected to the fifth conjunction node 404c.

The seventh master sub-section 314 can be configured to output the scan and clock mixing signal fb on the seventh master sub-section output node 314i as the function of the inversion of the clock signal NCK, the inversion of the scan enable signal nSE, the inversion of the scan input signal SI, and the master output signal m1. The seventh master sub-section 314 includes the tenth PMOS transistor 314a, the eleventh PMOS transistor 314b, the twelfth PMOS transistor 314c, the tenth NMOS transistor 314d, the eleventh NMOS transistor 314e, the twelfth NMOS transistor 314f, and the thirteenth NMOS transistor 314g for outputting the scan and clock mixing signal fb on the seventh master sub-section output node 314*i*. The eighth master sub-section 316 can be configured to perform the invert operation on the scan and clock mixing signal fb for outputting the master feedback signal nfb on the eighth master sub-section output node 316*d*. The eighth master sub-section 316 includes the thirteenth PMOS transistor 316*a*, and the fourteenth NMOS transistor 316*b* for outputting the master feedback signal nfb on the eighth master sub-section output node 316*d*. The eighth master sub-section 316 also includes the fourteenth PMOS transistor 316*c* to output the scan and clock mixing signal fb, when the scan and clock mixing signal fb of the seventh master sub-section 314 has not been connected to the eighth master sub-section 316 (i.e., when the master output signal m1=0, and the inversion of the scan input signal SIN=1 and the inversion of the scan enable signal nSE=1, and the inversion of the clock signal NCK=0). The ninth master sub-section 318 can be configured to perform the NOR operation on the master output signal m1, and the scan enable signal SE for outputting the internal control signal cse on the ninth master sub-section output node 318*e*. The ninth master sub-section 318 includes the fifteenth PMOS transistor 318*a*, the sixteenth PMOS transistor 318*b*, the fifteenth NMOS transistor 318*c*, and the sixteenth NMOS transistor 318*d* for outputting the internal control signal cse on the ninth master sub-section output node 318*e*. The configurations of the transistors of the seventh, eighth, and ninth master sub-sections (314, 316, and 318) and their intended functions are depicted in FIGS. 3*a*, and 3*b*.

The slave section 204 can be configured to provide the inverted output QN on the output node 324*c* based on the master output signal m1 generated by the master section 202. The slave section 204 includes the first slave sub-section 320, the second slave sub-section 322, and the third slave sub-section 324. The first slave sub-section 320 can be configured to perform the complex AND-OR invert operation on the master output signal m1, the inversion of the clock signal NCK, and the slave feedback signal nq for outputting the internal Boolean signal bq on the first slave sub-section output node 320*i*. The first slave sub-section 320 includes the seventeenth PMOS transistor 320*a*, the eighteenth PMOS transistor 320*b*, the nineteenth PMOS transistor 320*c*, the seventeenth NMOS transistor 320*d*, the eighteenth NMOS transistor 320*e*, and the nineteenth PMOS transistor 320*f* for outputting the internal Boolean signal bq on the first slave sub-section output node 320*i*. The second slave sub-section 322 can be configured to perform the invert operation on the internal Boolean signal bq for outputting the slave feedback signal nq on the second slave sub-section output node 322*c*. The second slave sub-section 322 includes the twentieth PMOS transistor 322*a*, and the twentieth NMOS transistor 322*b* for outputting the slave feedback signal nq on the second slave sub-section output node 322*c*. The third slave sub-section 324 can be configured to perform the invert operation on the internal Boolean signal bq to provide the inverted output QN on the output node 324*c*. The third slave sub-section 324 includes the twenty-first PMOS transistor 324*a*, and the twenty-first NMOS transistor 324*b* for providing the inverted output QN on the output node 324*c*. The configurations of the transistors of the first, second, and third slave sub-sections (320, 322, and 324) and their intended functions are depicted in FIGS. 3*a*, and 3*c*.

In an embodiment, the reset control signal R=1 may be provided to the flip-flop 200 to perform the reset operation. In such a case, the tenth master sub-section 402 outputs the inversion of the reset control signal NR=0 on the tenth master sub-section output node 402*c*. The inversion of the reset control signal NR=0 may be applied to the gate of the twenty-third PMOS and NMOS transistors (404*a*, 404*b*). As the NR=0, the twenty-third PMOS transistor 404*a* turns ON (the twenty third NMOS transistor 404*b* turns OFF) and outputs the master output signal m1=1 on the sixth master sub-section output node 312*f*. When the master output signal m1=1, the nineteenth NMOS transistor 320*f* of the first slave sub-section 320 turns ON and outputs the internal Boolean signal bq=0 on the first slave sub-section output node 320*i*. As the internal Boolean signal bq=0, the third slave sub-section 324 outputs the inverted output QN=1. Thus, performing the reset operation.

Figure 5:
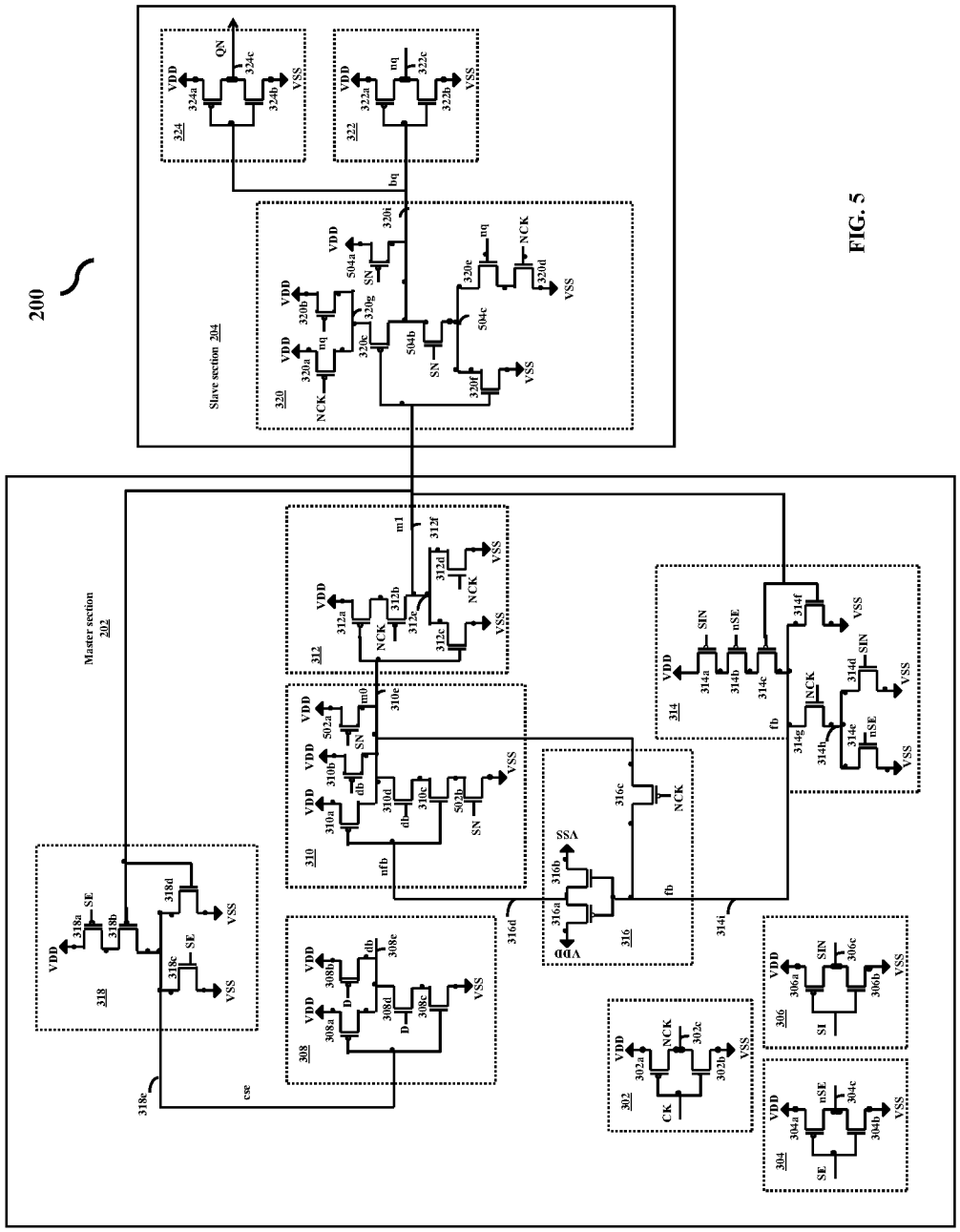
FIG. 5 depicts a circuit diagram depicting the flip-flop including a set functionality, according to embodiments as disclosed herein.

FIG. 5 depicts a circuit diagram depicting the flip-flop 200 including a set functionality, according to embodiments as disclosed herein. Embodiments herein enable the flip-flop 200 to perform a set operation by including the set functionality. In an embodiment, the set functionality may be achieved by implementing two transistors in the master section 202, and two transistors in the slave section 204. For example, the flip-flop 200 may perform the normal operation or the scan test operation if the set control signal SN has a high logic level (i.e., SN=1). The flip-flop 200 may perform the set operation if the set control signal SN has a low logic level (i.e., SN=0).

The master section 202 can be configured to receive the data input D, the scan enable signal SE, the scan input signal SI, the set control signal SN, and the clock signal CK and to generate the master output signal m1. The master section 202 includes the first-ninth master sub-sections (302-318) for generating the master output signal m1.

The first master sub-section 302 of the master section 202 can be configured to perform the invert operation on the clock signal CK for outputting the inversion of the clock signal NCK on the first master sub-section output node 302*c*. The first master sub-section 302 includes the first PMOS transistor 302*a*, and the first NMOS transistor 302*b* for outputting the inversion of the clock signal NCK on the first master sub-section output node 302*c*. The second master sub-section 304 can be configured to perform the invert operation on the scan enable signal SE for outputting the inversion of the scan enable signal nSE on the second master sub-section output node 304*c*. The second master sub-section 304 includes the second PMOS transistor 304*a*, and the second NMOS transistor 304*b* for outputting the inversion of the scan enable signal nSE on the second master sub-section output node 304*c*. The third master sub-section 306 can be configured to perform the invert operation on the scan input signal SI for outputting the inversion of the scan input signal SIN on the third master sub-section output node 306*c*. The third master sub-section 306 includes the third PMOS transistor 306*a*, and the third NMOS transistor 306*b* for outputting the inversion of the scan input signal SIN on the third master sub-section output node 306*c*. The fourth master sub-section 308 can be configured to perform the NAND operation on the data input D, and the internal control signal cse for outputting the inverted data signal db on the fourth master sub-section output node 308*e*. The fourth master sub-section 308 includes the fourth PMOS transistor 308*a*, the fifth PMOS transistor 308*b*, the fourth NMOS transistor 308*c*, and the fifth NMOS transistor 308*d* for outputting the inverted data signal db on the fourth master sub-section output node 308*e*. The configurations of the transistors of the first, second, third and fourth master sub-sections (302-308) and their intended functions are depicted in FIGS. 3*a*, and 3*b*.

The fifth master sub-section 310 can be configured to receive the inverted data signal db from the fourth master sub-section 308, the master feedback signal nfb from the eighth master sub-section 316, and the set control signal and to output the internal master signal m0 on the fifth master sub-section output node 310e. The fifth master sub-section 310 includes the sixth PMOS transistor 310a, the seventh PMOS transistor 310b, a twenty-fourth PMOS transistor 502a, the sixth NMOS transistor 310c, the seventh NMOS transistor 310d, and a twenty-fourth NMOS transistor 502b.

The sixth PMOS transistor 310a can be connected to the VDD voltage, the master feedback signal nfb outputted on a eighth master sub-section output node 316d, and the fifth master sub-section output node 310e. The seventh PMOS transistor 310b can be connected to the VDD voltage, the inverted data signal db outputted on the fourth master sub-section output node 308e, and the fifth master sub-section output node 310e. The twenty-fourth PMOS transistor 502a can be connected to the VDD voltage, the set control signal SN, and the fifth master sub-section output node 310e. The sixth PMOS transistor 310a includes the source connected to the VDD voltage, the gate connected to the master feedback signal nfb, and the drain connected to the fifth master sub-section output node 310e. The seventh PMOS transistor 310b includes the source connected to the VDD voltage, the gate connected to the inverted data signal db, and the drain connected to the fifth master sub-section output node 310e. The twenty-fourth PMOS transistor 502a includes a source connected to the VDD voltage, a gate connected to the set control signal SN, and a drain connected to the fifth master sub-section output node 310e.

The sixth NMOS transistor 310c can be connected to the twenty-fourth NMOS transistor 502b, the master feedback signal nfb, and the seventh NMOS transistor 310d. The seventh NMOS transistor 310d can be connected to the inverted data signal db outputted on the fourth master sub-section output node 308e, and the fifth master sub-section output node 310e. The twenty-fourth NMOS transistor 502b can be connected to the VSS voltage, and the set control signal SN. The sixth NMOS transistor 310c includes the source connected to a drain of the twenty-fourth NMOS transistor 502b, the gate connected to the master feedback signal nfb, and the drain connected to the source of the seventh NMOS transistor 310d. The seventh NMOS transistor 310d includes the gate connected to the inverted data signal db, and the drain connected to the fifth master sub-section output node 310e. The twenty-fourth NMOS transistor 502b includes a source connected to the VSS voltage, and a gate connected to the set control signal SN.

The sixth master sub-section 312 can be configured to perform the NOR operation on the internal signal m0 and the inversion of the clock signal NCK to generate the master output signal m1 on the sixth master sub-section output node 312f. The sixth master sub-section 312 includes the eighth PMOS transistor 312a, the ninth PMOS transistor 312b, the eighth NMOS transistor 312c, and the ninth NMOS transistor 312d for generating the master output signal m1 on the sixth master sub-section output node 312f. The seventh master sub-section 314 can be configured to output the scan and clock mixing signal fb on the seventh master sub-section output node 314i as the function of the inversion of the clock signal NCK, the inversion of the scan enable signal nSE, the inversion of the scan input signal SI, and the master output signal m1. The seventh master sub-section 314 includes the tenth PMOS transistor 314a, the eleventh PMOS transistor 314b, the twelfth PMOS transistor 314c, the tenth NMOS transistor 314d, the eleventh NMOS transistor 314e, the twelfth NMOS transistor 314f, and the thirteenth NMOS transistor 314g for outputting the scan and clock mixing signal fb on the seventh master sub-section output node 314i. The eighth master sub-section 316 can be configured to perform the invert operation on the scan and clock mixing signal fb for outputting the master feedback signal nfb on the eighth master sub-section output node 316d. The eighth master sub-section 316 includes the thirteenth PMOS transistor 316a, and the fourteenth NMOS transistor 316b for outputting the master feedback signal nfb on the eighth master sub-section output node 316d. The eighth master sub-section 316 also includes the fourteenth PMOS transistor 316c to output the scan and clock mixing signal fb, when the scan and clock mixing signal fb of the seventh master sub-section 314 has not been connected to the eighth master sub-section 316 (i.e., when the master output signal m1=0, and the inversion of the scan input signal SIN=1 and the inversion of the scan enable signal nSE=1, and the inversion of the clock signal NCK=0). The ninth master sub-section 318 can be configured to perform the NOR operation on the master output signal m1, and the scan enable signal SE for outputting the internal control signal cse on the ninth master sub-section output node 318e. The ninth master sub-section 318 includes the fifteenth PMOS transistor 318a, the sixteenth PMOS transistor 318b, the fifteenth NMOS transistor 318c, and the sixteenth NMOS transistor 318d for outputting the internal control signal cse on the ninth master sub-section output node 318e. The configurations of the transistors of the sixth, seventh, eighth, and ninth master sub-sections (312, 314, 316, and 318) and their intended functions are depicted in FIGS. 3a, and 3b.

The slave section 204 can be configured to provide the inverted output QN on the output node 324c based on the master output signal m1 generated by the master section 202. The first slave sub-section 320 of the slave section 320 can be configured to receive the master output signal m1 from the sixth master sub-section 312 of the master section 202, the inversion of the clock signal NCK from the first master sub-section 302, the slave feedback signal nq from the second slave sub-section 322, and the set control signal SN, and to output an internal Boolean signal bq on the first slave sub-section output node 320i. The first slave sub-section 320 includes the seventeenth PMOS transistor 320a, the eighteenth PMOS transistor 320b, the nineteenth PMOS transistor 320c, a twenty-fifth PMOS transistor 504a, the seventeenth NMOS transistor 320d, the eighteenth NMOS transistor 320e, the nineteenth PMOS transistor 320f, and a twenty-fifth NMOS transistor 504b.

The seventeenth PMOS transistor 320a can be connected to the VDD voltage, the inversion of the clock signal NCK outputted on the first master sub-section output node 302c, and the third conjunction node 320g. The eighteenth PMOS transistor 320b can be connected to the VDD voltage, the slave feedback signal nq outputted on the second slave sub-section output node 322c, and the third conjunction node 320g. The nineteenth PMOS transistor 320c can be connected to the third conjunction node 320g, the master output signal m1 outputted on the sixth master sub-section output node 312f, and the first slave sub-section output node 320i. The twenty-fifth PMOS transistor 504a can be connected to the VDD voltage, the set control signal SN, and the first slave sub-section output node 320i. The seventeenth PMOS transistor 320a includes the source connected to the VDD voltage, the gate connected to the inversion of the clock signal NCK, and the drain connected to the third conjunction node 320g. The eighteenth PMOS transistor 320b includes the source connected to the VDD voltage, the gate connected to the slave feedback signal nq, and the drain connected to the third conjunction node 320g. The nineteenth PMOS transistor 320c includes the source connected to the third conjunction node 320g, the gate connected to the master output signal m1, and the drain connected to the first slave sub-section output node 320i. The twenty-fifth NMOS transistor 504a includes a source connected to the VDD voltage, a gate connected to the set control signal SN, and a drain connected to the first slave sub-section output node 320i.

The seventeenth NMOS transistor 320d can be connected to the VSS voltage, the inversion of the clock signal NCK outputted on the first master sub-section output node 302c, and the eighteenth NMOS transistor 320e. The eighteenth NMOS transistor 320e can be connected to the slave feedback signal nq outputted on the second slave sub-section output node 320c, and a sixth conjunction node 504c. The nineteenth NMOS transistor 320f can be connected to the VSS voltage, the master output signal m1 outputted on the sixth master sub-section output node 312f, and the sixth conjunction node 504c. The twenty-fifth NMOS transistor 504b can be connected to the sixth conjunction node 504c, the set control signal and the first slave sub-section output node 320i. The seventeenth NMOS transistor 320d includes the source connected to the VSS voltage, the gate connected to the inversion of the clock signal NCK, and the drain connected to the source of the eighteenth NMOS transistor 320e. The eighteenth NMOS transistor 320e includes the gate connected to the slave feedback signal nq, and the drain connected to the sixth conjunction node 504c. The nineteenth NMOS transistor 320f includes the source connected to the VSS voltage, the gate connected to the master output signal m1, and the drain connected to the sixth conjunction node 504c. The twenty-fifth NMOS transistor 504b includes a source connected to the sixth conjunction node 504c, a gate connected to the set control signal SN, and a drain connected to the first slave sub-section output node 320i.

The second slave sub-section 322 includes the twentieth PMOS transistor 322a, and the twentieth NMOS transistor 322b for outputting the slave feedback signal nq on the second slave sub-section output node 322c. The third slave sub-section 324 can be configured to perform the invert operation on the internal Boolean signal bq to provide the inverted output QN on the output node 324c. The third slave sub-section 324 includes the twenty-first PMOS transistor 324a, and the twenty-first NMOS transistor 324b for providing the inverted output QN on the output node 324c. The configurations of the transistors of the second and third slave sub-sections (322 and 324) and their intended functions are depicted in FIGS. 3a, and 3c.

In an embodiment, the set control signal SN=0 may be applied to the flip-flop 200 to perform the set operation. In such a case, the SN=0 may be applied to the gates of the twenty-fourth PMOS and NMOS transistors (502a, 502b) in the fifth master sub-section 310 of the master section 202, and to the gates of the twenty-fifth PMOS and NMOS transistors (504a, 504b) in the first slave sub-section 320 of the slave section 204. When the SN=0, the twenty-fourth PMOS transistor 502a turns ON (the twenty-fourth NMOS transistor 502b turns OFF) and outputs the m0=1 on the fifth master sub-section output node 310e. As the m0=1, the sixth master sub-section 312 generates the master output signal m1=0 on the sixth master sub-section output node 310e. As the m1=0, and the SN=0, the twenty-fifth PMOS transistor 504a turns ON (the twenty-fifth NMOS transistor 504b turns OFF) and outputs the internal Boolean signal bq=1 on the first slave sub-section output node 320i. As the internal Boolean signal bq=1, the third slave section 324 provides the inverted output QN=0. Thus, performing the set operation.

Figure 6:
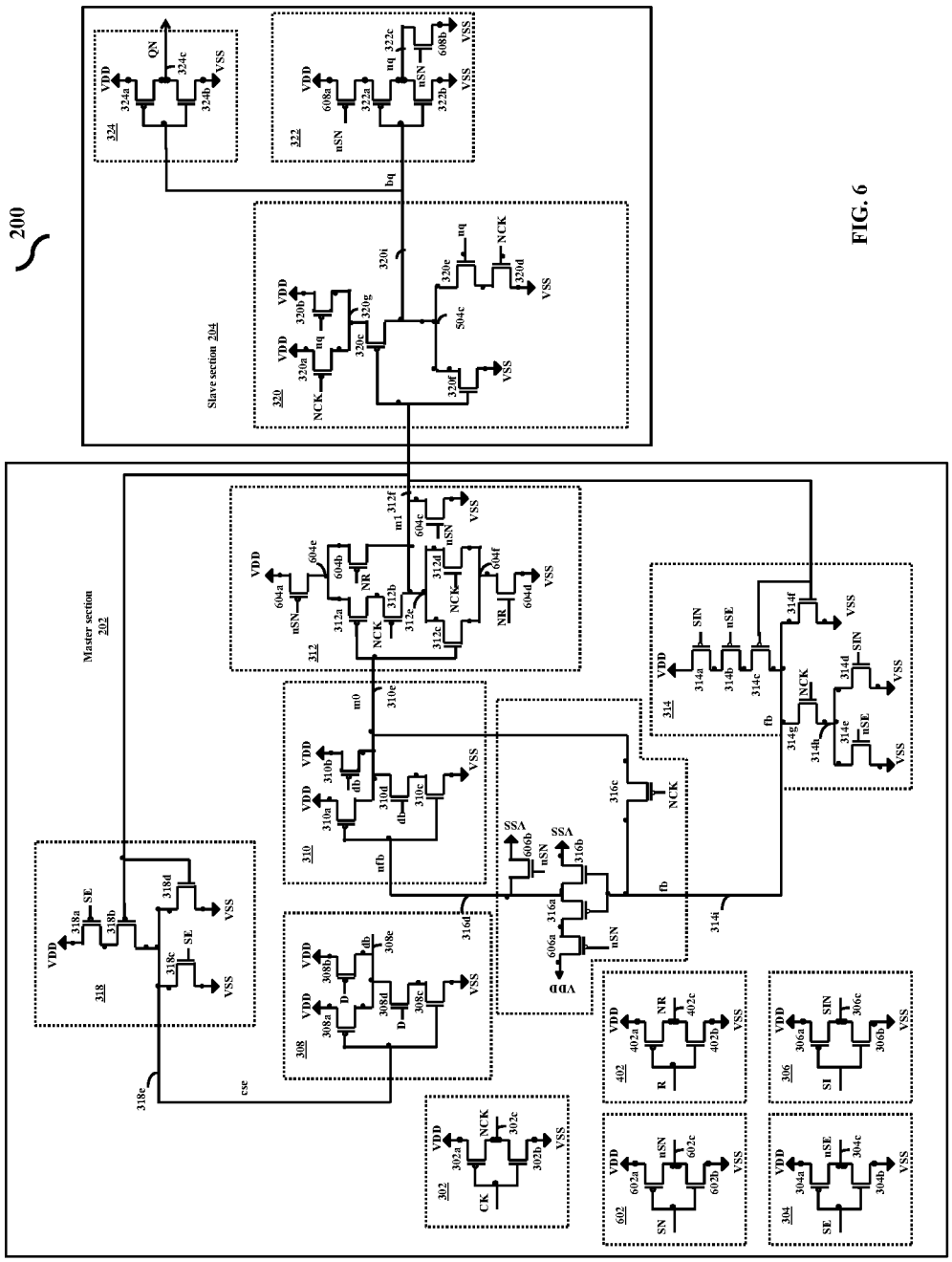
FIG. 6 is a circuit diagram depicting the flip-flop including a set-reset functionality with set priority, according to embodiments as disclosed herein.

FIG. 6 is a circuit diagram depicting the flip-flop 200 including a set-reset functionality with set priority, according to embodiments as disclosed herein. The flip-flop 200 may include the set-reset functionality with the set priority to perform the set operation or the reset operation. When the set control signal SN=0, and the reset control signal R=0, the flip-flop 200 performs the set operation. When the set control signal SN=1, and the reset control signal R=1, the flip-flop 200 performs the reset operation. When the set control signal SN=0, and the reset control signal R=1, the flip-flop 200 performs the set operation, as the flip-flop 200 includes the set priority.

The master section 202 of the flip-flop 200 can be configured to receive the data input D, the scan input signal SI, the scan enable signal SE, the set control signal SE, the reset control signal R, and the clock signal CK, and to generate the master output signal m1. In an embodiment, for achieving the set-reset functionality with the set priority, the master section 202 includes the first-ninth sub-sections (302-318), the tenth master sub-section 402, and a eleventh master sub-section 602.

The first master sub-section 302 can be configured to perform the invert operation on the clock signal CK for outputting the inversion of the clock signal NCK on the first master sub-section output node 302c. The first master sub-section 302 includes the first PMOS transistor 302a, and the first NMOS transistor 302b for outputting the inversion of the clock signal NCK on the first master sub-section output node 302c. The second master sub-section 304 can be configured to perform the invert operation on the scan enable signal SE for outputting the inversion of the scan enable signal nSE on the second master sub-section output node 304c. The second master sub-section 304 includes the second PMOS transistor 304a, and the second NMOS transistor 304b for outputting the inversion of the scan enable signal nSE on the second master sub-section output node 304c. The third master sub-section 306 can be configured to perform the invert operation on the scan input signal SI for outputting the inversion of the scan input signal SIN on the third master sub-section output node 306c. The third master sub-section 306 includes the third PMOS transistor 306a, and the third NMOS transistor 306b for outputting the inversion of the scan input signal SIN on the third master sub-section output node 306c. The configurations of the transistors of the first, second, and third master sub-sections (302-306) and their intended functions are depicted in FIGS. 3a, and 3b.

The tenth master sub-section 402 can be configured to perform the invert operation on the reset control signal R to output the inversion of the reset control signal NR on the tenth master sub-section output node 402c. The tenth master sub-section 402 includes the twenty-second PMOS transistor 402a, and the twenty-second NMOS transistor 402b for outputting the inversion of the rest control signal NR on the tenth master sub-section output node 402c. The configuration of the transistor of the tenth master sub-section 402 and its intended functions are depicted in FIG. 4.

The eleventh master sub-section 602 can be configured to receive the set control signal SN and to output an inversion of the set control signal nSN on a eleventh master sub-section output node 602c. The eleventh master sub-section 602 can be an inverter, which performs an invert operation on the set control signal to output the inversion of the set control signal nSN on the eleventh master sub-section output node 602c. The eleventh master sub-section 602 includes a twenty-sixth PMOS transistor 602a, and a twenty-sixth NMOS transistor 602 for outputting the inversion of the set control signal nSN on the eleventh master sub-section output node 602c. The twenty-sixth PMOS transistor 602a can be connected to the VDD voltage, the set control signal SN, and the eleventh master sub-section output node 602c. The twenty-sixth PMOS transistor 602a includes a source connected to the VDD voltage, a gate connected to the set control signal SN, and a drain connected to the eleventh master sub-section output node 602c. The twenty-sixth NMOS transistor 602b can be connected to the VSS voltage, the set control signal SN, and the eleventh master sub-section output node 602c. The twenty-sixth NMOS transistor 602b includes a source connected to the VSS voltage, a gate connected to the set control signal SN, and a drain connected to the eleventh master sub-section output node 602c. In an embodiment, when the set control signal SN=0, the twenty-sixth PMOS transistor 602a turns ON and outputs the inversion of the set control signal nSN=1 on the eleventh master sub-section output node 602c. In an embodiment, when the set control signal SN=1, the twenty-sixth NMOS transistor 602b turns ON and outputs the inversion of the set control signal nSN=0 on the eleventh master sub-section output node 602c.

The fourth master sub-section 308 can be configured to perform the NAND operation on the data input D, and the internal control signal cse for outputting the inverted data signal db on the fourth master sub-section output node 308e. The fourth master sub-section 308 includes the fourth PMOS transistor 308a, the fifth PMOS transistor 308b, the fourth NMOS transistor 308c, and the fifth NMOS transistor 308d for outputting the inverted data signal db on the fourth master sub-section output node 308e. The fifth master sub-section 310 can be configured to perform the NAND operation on the inverted data signal db, and the master feedback signal nfb for outputting the internal master signal m0 on the fifth master sub-section output node 310e. The fifth master sub-section 310 includes the sixth PMOS transistor 310a, the seventh PMOS transistor 310b, the sixth NMOS transistor 310c, and the seventh NMOS transistor 310d for outputting the internal master signal m0 on the fifth master sub-section output node 310e. The configurations of the transistors of the fourth, and fifth master sub-sections (304-310) and their intended functions are depicted in FIGS. 3a, and 3b.

The sixth master sub-section 312 can be configured to receive the internal master signal m0 from the fifth master sub-section 310, the inversion of the clock signal NCK from the first master sub-section 302, the inversion of the reset control signal NR from the tenth master sub-section 402, and the inversion of the set control signal nSN from the eleventh master sub-section 602 and to generate the master output signal m1 on the sixth master sub-section output node 312f. The sixth master sub-section 312 includes the eighth PMOS transistor 312a, the ninth PMOS transistor 312b, a twenty-seventh PMOS transistor 604a, a twenty-eighth PMOS transistor 604b, the eighth NMOS transistor 312c, the ninth NMOS transistor 312d, a twenty-seventh NMOS transistor 604c, and a twenty-seventh NMOS transistor 604d for generating the master output signal m1 on the sixth master sub-section output node 312f. The eighth PMOS transistor 312a can be connected to a seventh conjunction node 604e, the internal master signal m0 outputted on the fifth master sub-section output node 310e, and the ninth PMOS transistor 312b. The ninth PMOS transistor 312b can be connected to the inversion of the clock signal NCK outputted on the first master sub-section output node 302c, and the sixth master sub-section output node 312f. The twenty-seventh PMOS transistor 604a can be connected to the VDD voltage, the seventh conjunction node 604e, and the inversion of the set control signal nSN outputted on the eleventh master sub-section output node 602c. The twenty-eighth PMOS transistor 604b can be connected to the seventh conjunction node 604e, the inversion of the reset control signal NR outputted on the tenth master sub-section output node 402c, and the sixth master sub-section output node 312f. The eighth PMOS transistor 312a includes the source connected to the seventh conjunction node 604e, the gate connected to the internal master signal m0, and the drain connected to the source of the ninth PMOS transistor 312b. The ninth PMOS transistor 312b includes the gate connected to the inversion of the clock signal NCK and the drain connected to the sixth master sub-section output node 312f. The twenty-seventh PMOS transistor 604a includes a source connected to the VDD voltage, a gate connected to the inversion of the set control signal nSN, and a drain connected to the seventh conjunction node 604e. The twenty-eighth PMOS transistor 604b includes a source connected to the seventh conjunction node 604e, a gate connected to the inversion of the reset control signal NR, and a drain connected to the sixth master sub-section output node 312f.

The eighth NMOS transistor 312c can be connected to an eighth conjunction node 604f, the internal master signal m0 outputted on the fifth master sub-section output node 310e, and the first conjunction node 312e. The first conjunction mode 312e can be connected to the sixth master sub-section output node 312f. The ninth NMOS transistor 312d can be connected to the eighth conjunction node 604f, the inversion of the clock signal NCK, and the first conjunction node 312e. The twenty-seventh NMOS transistor 604c can be connected to the sixth master sub-section output node 310e, the VSS voltage, and the inversion of the set control signal nSN outputted on the eleventh master sub-section output node 602c. The twenty-eighth NMOS transistor 604d can be connected to the VSS voltage, the inversion of the reset control signal NR outputted on the tenth master sub-section output node 402c, and the eighth conjunction node 604f. The eighth NMOS transistor 312c includes the source connected to the eighth conjunction node 604f, the gate connected to the internal master signal m0, and the drain connected to the first conjunction node 312e. The ninth NMOS transistor 312d includes the source connected to the eighth conjunction node 604f, the gate connected to the inversion of the clock signal NCK, and the drain connected to the first conjunction node 312e. The twenty-seventh NMOS transistor 604c includes a source connected to VSS voltage, a gate connected to the inversion of the set control signal nSN, and a drain connected to the sixth master sub-section output node 312f. The twenty-eighth NMOS transistor 604d includes a source connected to the VSS voltage, a gate connected to the inversion of the reset control signal NR, and a drain connected to the eighth conjunction node 604f.

The seventh master sub-section 314 can be configured to output the scan and clock mixing signal fb on the seventh master sub-section output node 314i as the function of the inversion of the clock signal NCK, the inversion of the scan enable signal nSE, the inversion of the scan input signal SI, and the master output signal m1. The seventh master sub-section 314 includes the tenth PMOS transistor 314a, the eleventh PMOS transistor 314b, the twelfth PMOS transistor 314c, the tenth NMOS transistor 314d, the eleventh NMOS transistor 314e, the twelfth NMOS transistor 314f, and the thirteenth NMOS transistor 314g for outputting the scan and clock mixing signal fb on the seventh master sub-section output node 314*i*. The configurations of the transistors of the seventh master sub-section 314 and their intended functions are depicted in FIGS. 3*a*, and 3*b*.

The eighth master sub-section 316 can be configured to receive the scan and clock mixing signal fb, and the inversion of the set control signal nSN for outputting the master feedback signal nfb on the eighth master sub-section output node 316*d*. In an embodiment, the eighth master sub-section 316 includes the thirteenth PMOS transistor 316*a*, the fourteenth NMOS transistor 316*b*, a twenty-ninth PMOS transistor 606*a*, and a twenty-ninth NMOS transistor 606*b* for outputting the master feedback signal nfb on the eighth master sub-section output node 316*d*. The thirteenth PMOS transistor 316*a* can be connected to the twenty-ninth PMOS transistor 606*a*, the scan and clock mixing signal fb, and the eighth master sub-section output node 316*d*. The twenty-ninth PMOS transistor 606*a* can be connected to the VDD voltage, the inversion of the set control signal nSN outputted on the eleventh master sub-section output node 602*c*. The thirteenth PMOS transistor 316*a* includes the source connected to a drain of the twenty-ninth PMOS transistor 606*a*, the gate connected to the scan and clock mixing signal fb, and the drain connected to the eighth master sub-section output node 316*d*. The twenty-ninth PMOS transistor 606*a* includes a source connected to the VDD voltage, and a gate connected to the inversion of the set control signal nSN. The fourteenth NMOS transistor 316*b* can be connected to the VSS voltage, the scan and clock mixing signal fb, and the eighth master sub-section output node 316*d*. The fourteenth NMOS transistor 316*b* includes the source connected to the VSS voltage, the gate connected to the scan and clock mixing signal fb, and the drain connected to the eighth master sub-section output node 316*d*. The twenty-ninth NMOS transistor 606*b* can be connected to the VSS voltage, the inversion of the set control signal outputted on the eleventh master sub-section output node 602*c*, and the eighth master sub-section output node 316*d*. The twenty-ninth NMOS transistor 606*b* includes a source connected to the VSS voltage, a gate connected to the inversion of the set control signal nSN, and a drain connected to the eighth master sub-section output node 316*d*.

In an embodiment, when the inversion of the set control signal nSN=1, the twenty-ninth NMOS transistor 606*b* turns ON, (the twenty-ninth PMOS transistor 606*a* turns OFF) and outputs the master feedback signal nfb=0. In an embodiment, when the inversion of the set control signal nSN=0, the twenty-ninth PMOS transistor 606*a* turns ON, and the twenty-ninth PMOS transistor 606*b* turns OFF. In such a case, the eighth master sub-section 316 can output the master feedback signal nfb by performing normal functioning as depicted in FIG. 3*a*.

The eighth master sub-section 316 also includes the fourteenth PMOS transistor 316*c* to output the scan and clock mixing signal fb, when the scan and clock mixing signal fb of the seventh master sub-section 314 has not been connected to the eighth master sub-section 316 (i.e., when the master output signal m1=0, and the inversion of the scan input signal SIN=1 and the inversion of the scan enable signal nSE=1, and the inversion of the clock signal NCK=0). The configuration of the fourteenth PMOS transistor 316*c* of the eighth master sub-section 316 and its intended functions are as depicted in FIGS. 3*a*, and 3*b*.

The ninth master sub-section 318 can be configured to perform the NOR operation on the master output signal m1, and the scan enable signal SE for outputting the internal control signal cse on the ninth master sub-section output node 318*e*. The ninth master sub-section 318 includes the fifteenth PMOS transistor 318*a*, the sixteenth PMOS transistor 318*b*, the fifteenth NMOS transistor 318*c*, and the sixteenth NMOS transistor 318*d* for outputting the internal control signal cse on the ninth master sub-section output node 318*e*. The configurations of the transistors of the seventh, eighth, and ninth master sub-sections (314, 316, and 318) and their intended functions are depicted in FIGS. 3*a*, and 3*b*.

The slave section 204 can be configured to provide the inverted output QN on the output node 324*c* based on the master output signal m1 generated by the master section 202. The slave section 204 includes the first slave sub-section 320, the second slave sub-section 322, and the third slave sub-section 324. The first slave sub-section 320 can be configured to perform the complex AND-OR invert operation on the master output signal m1, the inversion of the clock signal NCK, and the slave feedback signal nq for outputting the internal Boolean signal bq on the first slave sub-section output node 320*i*. The first slave sub-section 320 includes the seventeenth PMOS transistor 320*a*, the eighteenth PMOS transistor 320*b*, the nineteenth PMOS transistor 320*c*, the seventeenth NMOS transistor 320*d*, the eighteenth NMOS transistor 320*e*, and the nineteenth PMOS transistor 320*f* for outputting the internal Boolean signal bq on the first slave sub-section output node 320*i*. The configurations of the transistors of the first sub-sections 320 and their intended functions are depicted in FIGS. 3*a*, and 3*c*.

The second slave sub-section 322 can be configured to receive the internal Boolean signal bq from the first slave sub-section 320 and the inversion of the set control signal nSN from the eleventh master sub-section 602 and to output the slave feedback signal nq on the second slave sub-section output node 322*c*. The second slave sub-section 322 includes the twentieth PMOS transistor 322*a*, a thirtieth PMOS transistor 608*a*, the twentieth NMOS transistor 322*b*, and a thirtieth NMOS transistor 608*b* for outputting the slave feedback signal nq on the second slave sub-section output node 322*c*. The twentieth PMOS transistor 322*a* can be connected to the internal Boolean signal bq outputted on the first slave sub-section output node 320*i*, the second slave sub-section output node 322*c*, and the thirtieth PMOS transistor 608*a*. The thirtieth PMOS transistor 608*a* can be connected to the VDD voltage, and the inversion of the set control signal nSN outputted on the eleventh master sub-section output node 602*c*. The twentieth PMOS transistor 322*a* includes the source connected to a drain of the thirtieth PMOS transistor 608*a*, the gate connected to the internal Boolean signal bq, and the drain connected to the second slave sub-section output node 322*c*. The thirtieth PMOS transistor 608*a* includes a source connected to the VDD voltage, a gate connected to the inversion of the set control signal nSN. The twentieth NMOS transistor 322*b* can be connected to the VSS voltage, the internal Boolean signal bq outputted on the first slave sub-section output node 320*i*, and the second slave sub-section output node 322*c*. The thirtieth NMOS transistor 608*b* can be connected to the VSS voltage, the inversion of the set control signal nSN outputted on the eleventh master sub-section output node 602*c*, and the second slave sub-section output node 322*c*. The twentieth NMOS transistor 322*b* includes the source connected to the VSS voltage, the gate connected to the internal Boolean signal bq, and the drain connected to the second slave sub-section output node 322*c*. The thirtieth NMOS transistor 608*b* includes a source connected to the VSS voltage, a gate connected to the inversion of the set control signal nSN, and a drain connected to the second slave sub-section output node 322*c*.

The third slave sub-section 324 can be configured to perform the invert operation on the internal Boolean signal bq to provide the inverted output QN on the output node 324c. The third slave sub-section 324 includes the twenty-first PMOS transistor 324a, and the twenty-first NMOS transistor 324b for providing the inverted output QN on the output node 324c. The configurations of the transistors of the third slave sub-section 324 and their intended functions are depicted in FIGS. 3a, and 3c.

Consider an example scenario, wherein the reset control signal R=1 (reset active), and the set control signal SN=1 may be applied to the flip-flop 200 to perform the reset operation. When the reset control signal R=1, and the set control signal SN=1, the tenth master sub-section 402 outputs the inversion of the reset control signal NR=0 on the tenth master sub-section output node 402c, and the eleventh master sub-section 602 outputs the inversion of the set control signal nSN=0 on the eleventh master sub-section output node 602c. The inversion of the reset control signal NR=0 and the inversion of the set control signal nSN=0 may be applied to the sixth master sub-section 312. In the sixth master sub-section 312, the twenty-seventh and twenty-eighth PMOS transistors (604a, 604b) turn ON and provide the master output signal m1=1 on the sixth master sub-section output node 312f. As the master output master signal m1=1, the first slave sub-section 320 outputs the internal Boolean signal bq=0 on the first slave sub-section output node 320i. As the internal Boolean signal bq=0, the third slave sub-section 324 provides the inverted output signal QN=1 on the third slave sub-section output node 324c. Thus, performing the reset operation.

Consider an example scenario, wherein the reset control signal R=0, and the set control signal SN=0 (set active) may be applied to the flip-flop 200 to perform the set operation. When the reset control signal R=0, and the set control signal SN=0, the tenth master sub-section 402 outputs the inversion of the reset control signal NR=1 on the tenth master sub-section output node 402c, and the eleventh master sub-section 602 outputs the inversion of the set control signal nSN=1 on the eleventh master sub-section output node 602c. The inversion of the reset control signal NR=1 and the inversion of the set control signal nSN=1 may be applied to the sixth master sub-section 312, and the second slave sub-section 322. In the sixth master sub-section 312, the twenty-seventh NMOS transistor 604c turns ON and provides the master output signal m1=0 on the sixth master sub-section output node 312f. In the second slave sub-section 322, the thirtieth NMOS transistor 608b turns ON and outputs the slave feedback signal nq=0 on the second slave sub-section output node 322c. As the slave feedback signal nq=0, the first slave sub-section 320 outputs internal Boolean signal bq=1 on the first slave sub-section output node 320i. As the internal Boolean signal bq=1, the third slave sub-section 324 provides the inverted output signal QN=0 on the third slave sub-section output node 324c. Thus, performing the set operation.

Consider an example scenario, wherein the reset control signal R=1, and the set control signal SN=0 (with the set priority) may be applied to the flip-flop 200 to perform the set operation. When the reset control signal R=1, and the set control signal SN=0, the tenth master sub-section 402 outputs the inversion of the reset control signal NR=0 on the tenth master sub-section output node 402c, and the eleventh master sub-section 602 outputs the inversion of the set control signal nSN=1 on the eleventh master sub-section output node 602c. The inversion of the reset control signal NR=0 and the inversion of the set control signal nSN=1 may be applied to the sixth master sub-section 312, and the second slave sub-section 322. In the sixth master sub-section 312, the twenty-eighth PMOS transistor 604b turns ON and provides the master output signal m1=0 on the sixth master sub-section output node 312f. In the second slave sub-section 322, the thirtieth NMOS transistor 608b turns ON and outputs the slave feedback signal nq=0 on the second slave sub-section output node 322c. As the slave feedback signal nq=0, the first slave sub-section 320 outputs internal Boolean signal bq=1 on the first slave sub-section output node 320i. As the internal Boolean signal bq=1, the third slave sub-section 324 provides the inverted output signal QN=0 on the third slave sub-section output node 324c. Thus, performing the set operation when both the set and reset is active.

Figure 7:
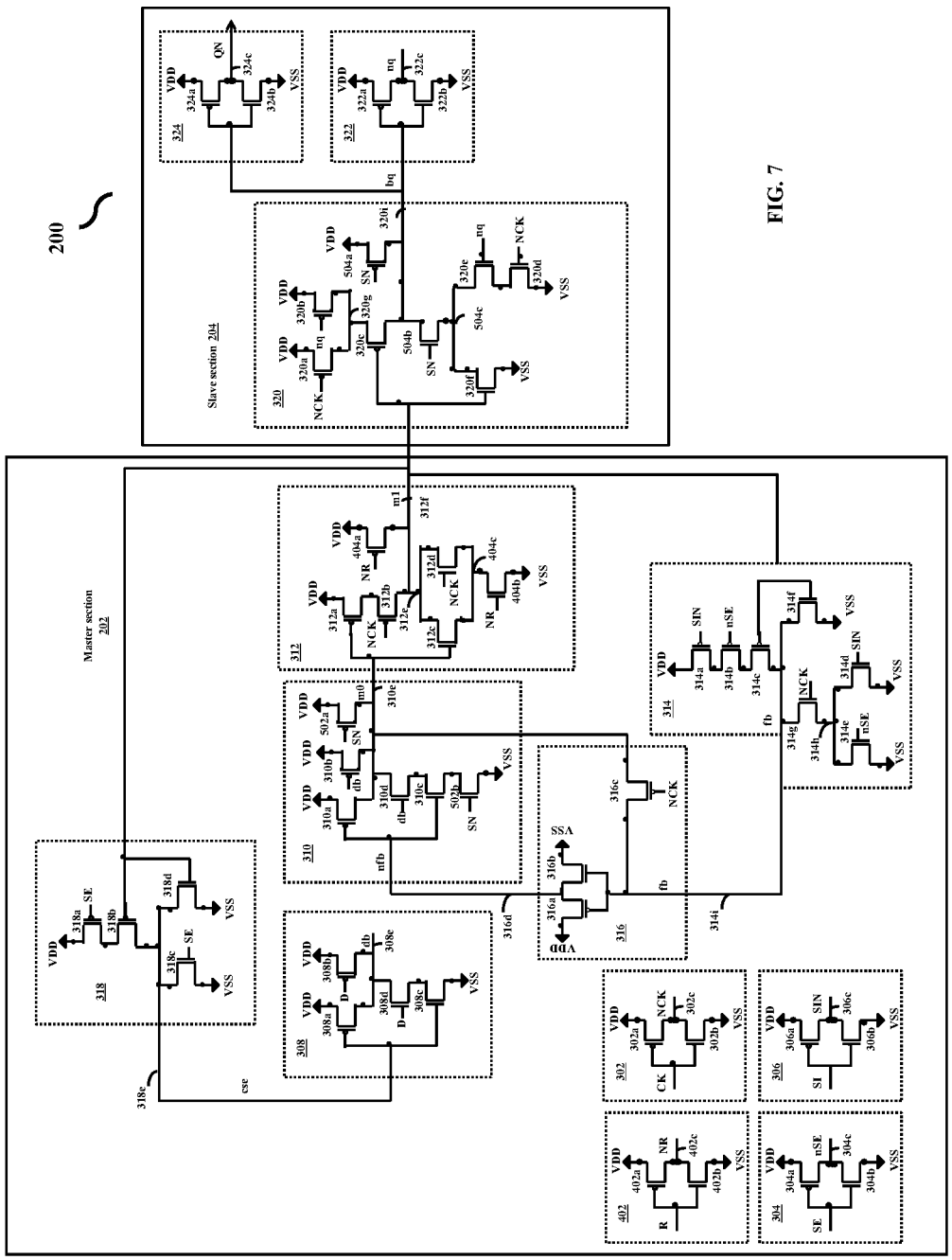
FIG. 7 is a circuit diagram depicting the flip-flop including the set-reset functionality with no priority, according to embodiments as disclosed herein.

FIG. 7 is a circuit diagram depicting the flip-flop 200 including the set-reset functionality with no priority, according to embodiments as disclosed herein. The flip-flop 200 may include the set-reset functionality to perform the set operation or the reset operation with no priority. When the set control signal SN=0, and the reset control signal R=0, the flip-flop 200 performs the set operation. When the set control signal SN=1, and the reset control signal R=1, the flip-flop 200 performs the reset operation. When the set control signal SN=0, and the reset control signal R=1, the flip-flop 200 performs either the set operation or the reset operation, as the flip-flop 200 does not include the set priority.

The master section 202 of the flip-flop 200 can be configured to receive the data input D, the scan enable signal SE, the scan input signal SI, the set control signal SN, the reset control signal R, and the clock signal CK and to generate the master output signal m1. The master section 202 includes the first-ninth master sub-sections (302-318), and the tenth master sub-section 402.

The first master sub-section 302 can be configured to perform the invert operation on the clock signal CK for outputting the inversion of the clock signal NCK on the first master sub-section output node 302c. The first master sub-section 302 includes the first PMOS transistor 302a, and the first NMOS transistor 302b for outputting the inversion of the clock signal NCK on the first master sub-section output node 302c. The second master sub-section 304 can be configured to perform the invert operation on the scan enable signal SE for outputting the inversion of the scan enable signal nSE on the second master sub-section output node 304c. The second master sub-section 304 includes the second PMOS transistor 304a, and the second NMOS transistor 304b for outputting the inversion of the scan enable signal nSE on the second master sub-section output node 304c. The third master sub-section 306 can be configured to perform the invert operation on the scan input signal SI for outputting the inversion of the scan input signal SIN on the third master sub-section output node 306c. The third master sub-section 306 includes the third PMOS transistor 306a, and the third NMOS transistor 306b for outputting the inversion of the scan input signal SIN on the third master sub-section output node 306c. The fourth master sub-section 308 can be configured to perform the NAND operation on the data input D, and the internal control signal cse for outputting the inverted data signal db on the fourth master sub-section output node 308e. The configurations of the transistors of the first, second, and third master sub-sections (302-306) and their intended functions are depicted in FIGS. 3a, and 3b.

The tenth master sub-section 402 can be configured to perform the invert operation on the reset control signal R to output the inversion of the reset control signal NR on the tenth master sub-section output node 402c. The tenth master sub-section 402 includes the twenty-second PMOS transistor 402a, and the twenty-second NMOS transistor 402b for outputting the inversion of the rest control signal NR on the tenth master sub-section output node 402c. The configuration of the transistor of the tenth master sub-section 402 and its intended functions are depicted in FIG. 4.

The fourth master sub-section 308 can be configured to perform the NAND operation on the data input D, and the internal control signal cse for outputting the inverted data signal db on the fourth master sub-section output node 308e. The fourth master sub-section 308 includes the fourth PMOS transistor 308a, the fifth PMOS transistor 308b, the fourth NMOS transistor 308c, and the fifth NMOS transistor 308d for outputting the inverted data signal db on the fourth master sub-section output node 308e. The configuration of the transistors of the fourth master sub-section 308 and their intended functions are depicted in FIGS. 3a, and 3b.

The fifth master sub-section 310 can be configured to receive the inverted data signal db from the fourth master sub-section 308, the master feedback signal nfb from the eighth master sub-section 316, and the set control signal SN and to output the internal master signal m0 on the fifth master sub-section output node 310e. The fifth master sub-section 310 includes the sixth PMOS transistor 310a, the seventh PMOS transistor 310b, the twenty-fourth PMOS transistor 502a, the sixth NMOS transistor 310c, the seventh NMOS transistor 310d, and the twenty-fourth NMOS transistor 502b for outputting the internal master signal m0 on the fifth master sub-section output node 310e. The configuration of the transistors of the fifth master sub-section 310 and their intended functions are depicted in FIG. 5.

The sixth master sub-section 312 can be configured to receive the internal master signal m0 from the fifth master sub-section 310, the inversion of the clock signal NCK from the first master sub-section 302 and the inversion of the reset control signal NR from the tenth master sub-section 402 and to generate the master output signal m1 on the sixth master sub-section output node 312f. The sixth master sub-section 312 includes the eighth PMOS transistor 312a, the ninth PMOS transistor 312b, the twenty-third PMOS transistor 404a, the eighth NMOS transistor 312c, the ninth NMOS transistor 312d, and the twenty-third NMOS transistor 404b for generating the master output signal m1 on the sixth master sub-section output node 312f. The configuration of the transistors of the fifth master sub-section 310 and their intended functions are depicted in FIG. 5.

The seventh master sub-section 314 can be configured to output the scan and clock mixing signal fb on the seventh master sub-section output node 314i as the function of the inversion of the clock signal NCK, the inversion of the scan enable signal nSE, the inversion of the scan input signal SI, and the master output signal m1. The seventh master sub-section 314 includes the tenth PMOS transistor 314a, the eleventh PMOS transistor 314b, the twelfth PMOS transistor 314c, the tenth NMOS transistor 314d, the eleventh NMOS transistor 314e, the twelfth NMOS transistor 314f, and the thirteenth NMOS transistor 314g for outputting the scan and clock mixing signal fb on the seventh master sub-section output node 314i. The eighth master sub-section 316 can be configured to perform the invert operation on the scan and clock mixing signal fb for outputting the master feedback signal nfb on the eighth master sub-section output node 316d. The eighth master sub-section 316 includes the thirteenth PMOS transistor 316a, and the fourteenth NMOS transistor 316b for outputting the master feedback signal nfb on the eighth master sub-section output node 316d. The eighth master sub-section 316 also includes the fourteenth PMOS transistor 316c to output the scan and clock mixing signal fb, when the scan and clock mixing signal fb of the seventh master sub-section 314 has not been connected to the eighth master sub-section 316 (i.e., when the master output signal m1=0, and the inversion of the scan input signal SIN=1 and the inversion of the scan enable signal nSE=1, and the inversion of the clock signal NCK=0). The ninth master sub-section 318 can be configured to perform the NOR operation on the master output signal m1, and the scan enable signal SE for outputting the internal control signal cse on the ninth master sub-section output node 318e. The ninth master sub-section 318 includes the fifteenth PMOS transistor 318a, the sixteenth PMOS transistor 318b, the fifteenth NMOS transistor 318c, and the sixteenth NMOS transistor 318d for outputting the internal control signal cse on the ninth master sub-section output node 318e. The configurations of the transistors of the seventh, eighth, and ninth master sub-sections (314, 316, and 318) and their intended functions are depicted in FIGS. 3a, and 3b.

The slave section 204 can be configured to provide the inverted output QN on the output node 324c based on the master output signal m1 generated by the master section 202. The first slave sub-section 320 of the slave section 320 can be configured to receive the master output signal m1 from the sixth master sub-section 312 of the master section 202, the inversion of the clock signal NCK from the first master sub-section 302, the slave feedback signal nq from the second slave sub-section 322, and the set control signal SN, and to output an internal Boolean signal bq on the first slave sub-section output node 320i. The first slave sub-section 320 includes the seventeenth PMOS transistor 320a, the eighteenth PMOS transistor 320b, the nineteenth PMOS transistor 320c, the twenty-fifth PMOS transistor 504a, the seventeenth NMOS transistor 320d, the eighteenth NMOS transistor 320e, the nineteenth PMOS transistor 320f, and the twenty-fifth NMOS transistor 504b. The configuration of the transistors of the first slave sub-section 320 and their intended functions are depicted in FIG. 5.

The second slave sub-section 322 includes the twentieth PMOS transistor 322a, and the twentieth NMOS transistor 322b for outputting the slave feedback signal nq on the second slave sub-section output node 322c. The third slave sub-section 324 can be configured to perform the invert operation on the internal Boolean signal bq to provide the inverted output QN on the output node 324c. The third slave sub-section 324 includes the twenty-first PMOS transistor 324a, and the twenty-first NMOS transistor 324b for providing the inverted output QN on the output node 324c. The configurations of the transistors of the second and third slave sub-sections (322 and 324) and their intended functions are depicted in FIGS. 3a, and 3c.

Consider an example scenario, wherein the reset control signal R=1, and the set control signal SN=1 may be provided to the flip-flop 200 to perform the reset function. In such a case, the tenth master sub-section 402 outputs the inversion of the reset control signal NR=0 on the tenth master sub-section output node 402c. The set control signal SN=1 may be applied to the gates of the twenty-fourth PMOS and NMOS transistors (502a, 502b) of the fifth master sub-section 310, which provides the internal master signal m0=0. The inversion of the reset control signal NR=0 may be applied to the gates of the twenty-third PMOS, and NMOS transistors (402a, 402b) of the sixth master sub-section 312. As the NR=0, the twenty-third PMOS transistor 402a turns ON and generates the master output signal m1=1. As the master output signal m1=1, the first slave sub-section 320 outputs the internal Boolean signal bq=0. As the internal Boolean signal bq=0, the third slave sub-section 324 outputs the inverted output QN=1. Thus, performing the reset operation.

Consider an example scenario, wherein the reset control signal R=0, and the set control signal SN=0 may be provided to the flip-flop 200 to perform the set function. In such a case, the tenth master sub-section 402 outputs the inversion of the reset control signal NR=1 on the tenth master sub-section output node 402c. The set control signal SN=0 may be applied to the gates of the twenty-fourth PMOS and NMOS transistors (502a, 502b) of the fifth master sub-section 310 and to the gates of the twenty-fifth PMOS and NMOS transistors (504a, 504b) in the first slave sub-section 320 of the slave section 204. The twenty-fourth PMOS transistor 502a turns ON and provides the internal master signal m0=1. The inversion of the reset control signal NR=0 may be applied to the gates of the twenty-third PMOS, and NMOS transistors (402a, 402b) of the sixth master sub-section 312, which generates the master output signal m1=0, as the NR=0, and the m0=1. As the master output signal m1=0 and the SN=0, the first slave sub-section 320 outputs the internal Boolean signal bq=1. As the internal Boolean signal bq=1, the third slave sub-section 324 outputs the inverted output QN=0. Thus, performing the set operation.

Consider an example scenario, wherein the reset control signal R=1, and the set control signal SN=0 may be applied to the flip-flop 200 with no priority. In such a case, the flip-flop 200 may perform either the set operation or the reset operation by providing the inverted output QN=0 or QN=1.

Figure 8:
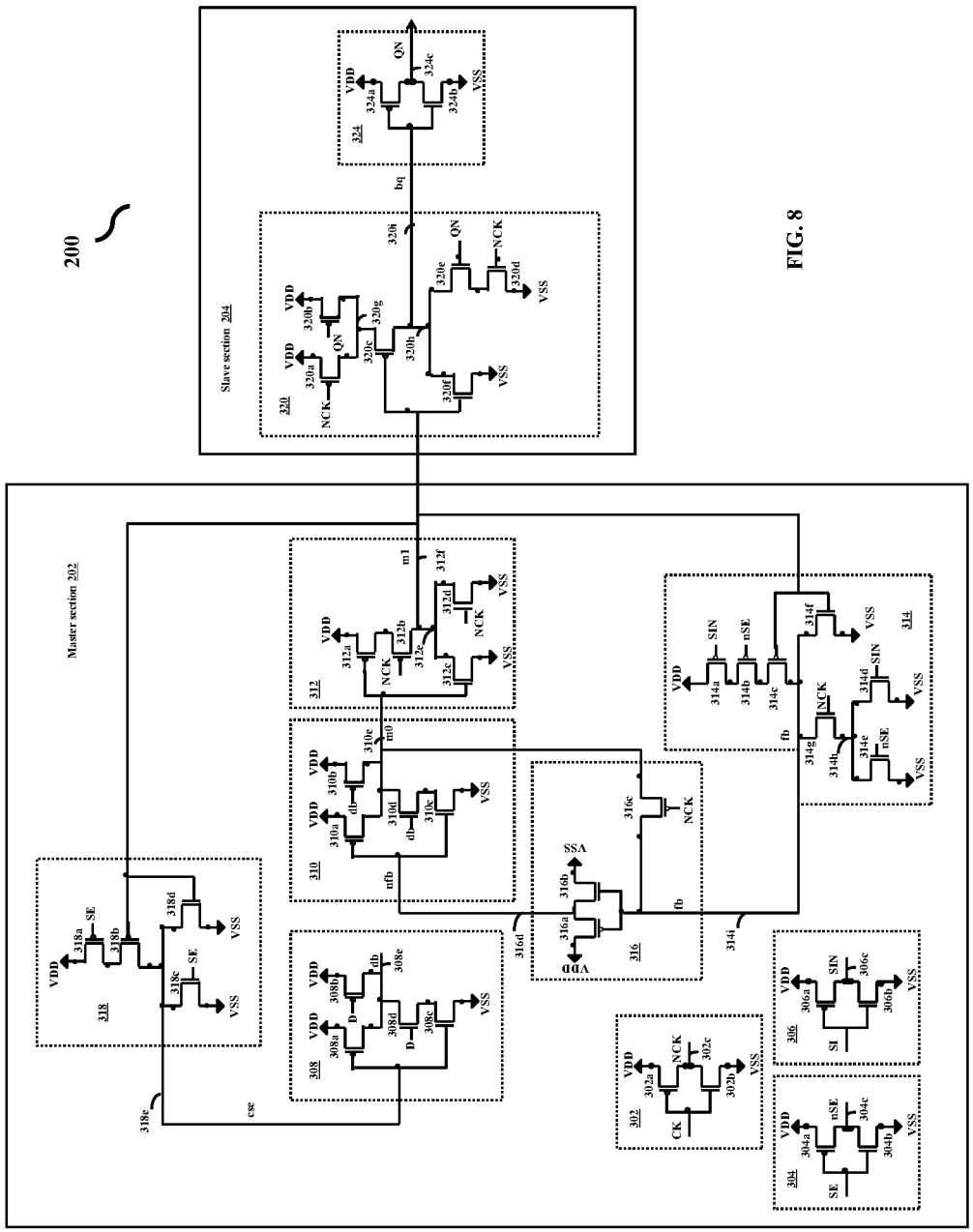
FIG. 8 is a circuit diagram depicting the flip-flop including a bared inverted output QN, according to embodiments as disclosed herein.

FIG. 8 is a circuit diagram depicting the flip-flop 200 including a bared inverted output QN, according to embodiments as disclosed herein.

The master section 202 of the flip-flop 202 can be configured to receive the data input D, the scan enable signal SE, the scan input signal SI, and the clock signal CK and to generate the master output signal m1. The master section 202 includes the first-ninth sub-sections (302-318) to generate the master output signal m1.

The first master sub-section 302 can be configured to perform the invert operation on the clock signal CK for outputting the inversion of the clock signal NCK on the first master sub-section output node 302c. The first master sub-section 302 includes the first PMOS transistor 302a, and the first NMOS transistor 302b for outputting the inversion of the clock signal NCK on the first master sub-section output node 302c. The second master sub-section 304 can be configured to perform the invert operation on the scan enable signal SE for outputting the inversion of the scan enable signal nSE on the second master sub-section output node 304c. The second master sub-section 304 includes the second PMOS transistor 304a, and the second NMOS transistor 304b for outputting the inversion of the scan enable signal nSE on the second master sub-section output node 304c. The third master sub-section 306 can be configured to perform the invert operation on the scan input signal SI for outputting the inversion of the scan input signal SIN on the third master sub-section output node 306c. The third master sub-section 306 includes the third PMOS transistor 306a, and the third NMOS transistor 306b for outputting the inversion of the scan input signal SIN on the third master sub-section output node 306c.

The fourth master sub-section 308 can be configured to perform the NAND operation on the data input D, and the internal control signal cse for outputting the inverted data signal db on the fourth master sub-section output node 308e. The fourth master sub-section 308 includes the fourth PMOS transistor 308a, the fifth PMOS transistor 308b, the fourth NMOS transistor 308c, and the fifth NMOS transistor 308d for outputting the inverted data signal db on the fourth master sub-section output node 308e. The fifth master sub-section 310 can be configured to perform the NAND operation on the inverted data signal db, and the master feedback signal nfb for outputting the internal master signal m0 on the fifth master sub-section output node 310e. The fifth master sub-section 310 includes the sixth PMOS transistor 310a, the seventh PMOS transistor 310b, the sixth NMOS transistor 310c, and the seventh NMOS transistor 310d for outputting the internal master signal m0 on the fifth master sub-section output node 310e. The sixth master sub-section 312 can be configured to perform the NOR operation on the internal signal m0 and the inversion of the clock signal NCK to generate the master output signal m1 on the sixth master sub-section output node 312f. The sixth master sub-section 312 includes the eighth PMOS transistor 312a, the ninth PMOS transistor 312b, the eighth NMOS transistor 312c, and the ninth NMOS transistor 312d for generating the master output signal m1 on the sixth master sub-section output node 312f.

The seventh master sub-section 314 can be configured to output the scan and clock mixing signal fb on the seventh master sub-section output node 314i as the function of the inversion of the clock signal NCK, the inversion of the scan enable signal nSE, the inversion of the scan input signal SI, and the master output signal m1. The seventh master sub-section 314 includes the tenth PMOS transistor 314a, the eleventh PMOS transistor 314b, the twelfth PMOS transistor 314c, the tenth NMOS transistor 314d, the eleventh NMOS transistor 314e, the twelfth NMOS transistor 314f, and the thirteenth NMOS transistor 314g for outputting the scan and clock mixing signal fb on the seventh master sub-section output node 314i. The eighth master sub-section 316 can be configured to perform the invert operation on the scan and clock mixing signal fb for outputting the master feedback signal nfb on the eighth master sub-section output node 316d. The eighth master sub-section 316 includes the thirteenth PMOS transistor 316a, and the fourteenth NMOS transistor 316b for outputting the master feedback signal nfb on the eighth master sub-section output node 316d. The eighth master sub-section 316 also includes the fourteenth PMOS transistor 316c to output the scan and clock mixing signal fb, when the scan and clock mixing signal fb of the seventh master sub-section 314 has not been connected to the eighth master sub-section 316 (i.e., when the master output signal m1=0, and the inversion of the scan input signal SIN=1 and the inversion of the scan enable signal nSE=1, and the inversion of the clock signal NCK=0). The ninth master sub-section 318 can be configured to perform the NOR operation on the master output signal m1, and the scan enable signal SE for outputting the internal control signal cse on the ninth master sub-section output node 318e. The ninth master sub-section 318 includes the fifteenth PMOS transistor 318a, the sixteenth PMOS transistor 318b, the fifteenth NMOS transistor 318c, and the sixteenth NMOS transistor 318d for outputting the internal control signal cse on the ninth master sub-section output node 318e. The configurations of the transistors of the first-ninth master sub-sections (302-318) and their intended functions are depicted in FIGS. 3a, and 3b.

The slave section 204 can be configured to receive the master output signal m1, and provide the bared inverted output QN. In an embodiment, the slave section 204 includes the first slave sub-section 320, and the third sub-slave section 324 to provide the bared inverted output QN. The slave section 204 includes two sub-sections: the first slave sub-section 320, and the third sub-slave section 324 to provide the bared inverted output QN.

The first slave sub-section 320 can be configured to perform the complex AND-OR invert operation on the master output signal m1, the inversion of the clock signal NCK, and the bared inverted output QN for outputting the internal Boolean signal bq on the first slave sub-section output node 320*i*. The first slave sub-section 320 includes the seventeenth PMOS transistor 320*a*, the eighteenth PMOS transistor 320*b*, the nineteenth PMOS transistor 320*c*, the seventeenth NMOS transistor 320*d*, the eighteenth NMOS transistor 320*e*, and the nineteenth PMOS transistor 320*f* for outputting the internal Boolean signal bq on the first slave sub-section output node 320*i*.

The seventeenth PMOS transistor 320*a* can be connected to the VDD voltage, the inversion of the clock signal NCK outputted on the first master sub-section output node 302*c*, and the third conjunction node 320*g*. The eighteenth PMOS transistor 320*b* can be connected to the VDD voltage, the bared inverted output QN present on the output node 324*c*. The nineteenth PMOS transistor 320*c* can be connected to the third conjunction node 320*g*, the master output signal m1 outputted on the sixth master sub-section output node 312*f*, and the first slave sub-section output node 320*i*. The seventeenth PMOS transistor 320*a* includes the source connected to the VDD voltage, the gate connected to the inversion of the clock signal NCK, and the drain connected to the third conjunction node 320*g*. The eighteenth PMOS transistor 320*b* includes the source connected to the VDD voltage, the gate connected to the bared inverted output QN, and the drain connected to the third conjunction node 320*g*. The nineteenth PMOS transistor 320*c* includes the source connected to the third conjunction node 320*g*, the gate connected to the master output signal m1, and the drain connected to the first slave sub-section output node 320*i*.

The seventeenth NMOS transistor 320*d* can be connected to the VSS voltage, the inversion of the clock signal NCK outputted on the first master sub-section output node 302*c*, and the eighteenth NMOS transistor 320*e*. The eighteenth NMOS transistor 320*e* can be connected to the bared inverted output QN present the output node 324*c*, and the fourth conjunction node 320*h*. The fourth conjunction node 320*h* can be connected to the first slave sub-section output node 320*i*. The nineteenth NMOS transistor 320*f* can be connected to the VSS voltage, the master output signal m1 outputted on the sixth master sub-section output node 312*f*, and the fourth conjunction node 320*h*. The seventeenth NMOS transistor 320*d* includes the source connected to the VSS voltage, the gate connected to the inversion of the clock signal NCK, and the drain connected to a source of the eighteenth NMOS transistor 320*e*. The eighteenth NMOS transistor 320*e* includes the gate connected to the bared inverted output QN, and the drain connected to the fourth conjunction node 320*h*. The nineteenth NMOS transistor 320*f* includes the source connected to the VSS voltage, the gate connected to the master output signal m1, and the drain connected to the fourth conjunction node 320*h*.

The third slave sub-section 324 can be configured to receive the internal Boolean signal bq from the first slave sub-section 322, and to provide the bared inverted output QN on the output node 324*c*. The third slave sub-section 324 can perform the invert operation on the internal Boolean signal bq to provide the bared inverted output QN on the output node 324*c*.

The third slave sub-section 324 includes the twenty-first PMOS transistor 324*a*, and the twenty-first NMOS transistor 324*b*. The twenty-first PMOS transistor 324*a* can be connected to the VDD voltage, the internal Boolean signal bq outputted on the first slave sub-section output node 320*i*, and the output node 324*c*. The twenty-first PMOS transistor 322*a* includes the source connected to the VDD voltage, the gate connected to the internal Boolean signal bq, and the drain connected to the output node 324*c*. The twenty-first NMOS transistor 324*b* can be connected to the VSS voltage, the internal Boolean signal bq outputted on the first slave sub-section output node 320*i*, and the output node 324*c*. The twenty-first NMOS transistor 324*b* includes the source connected to the VSS voltage, the gate connected to the internal Boolean signal bq, and the drain connected to the output node 324*c*.

Figure 9:
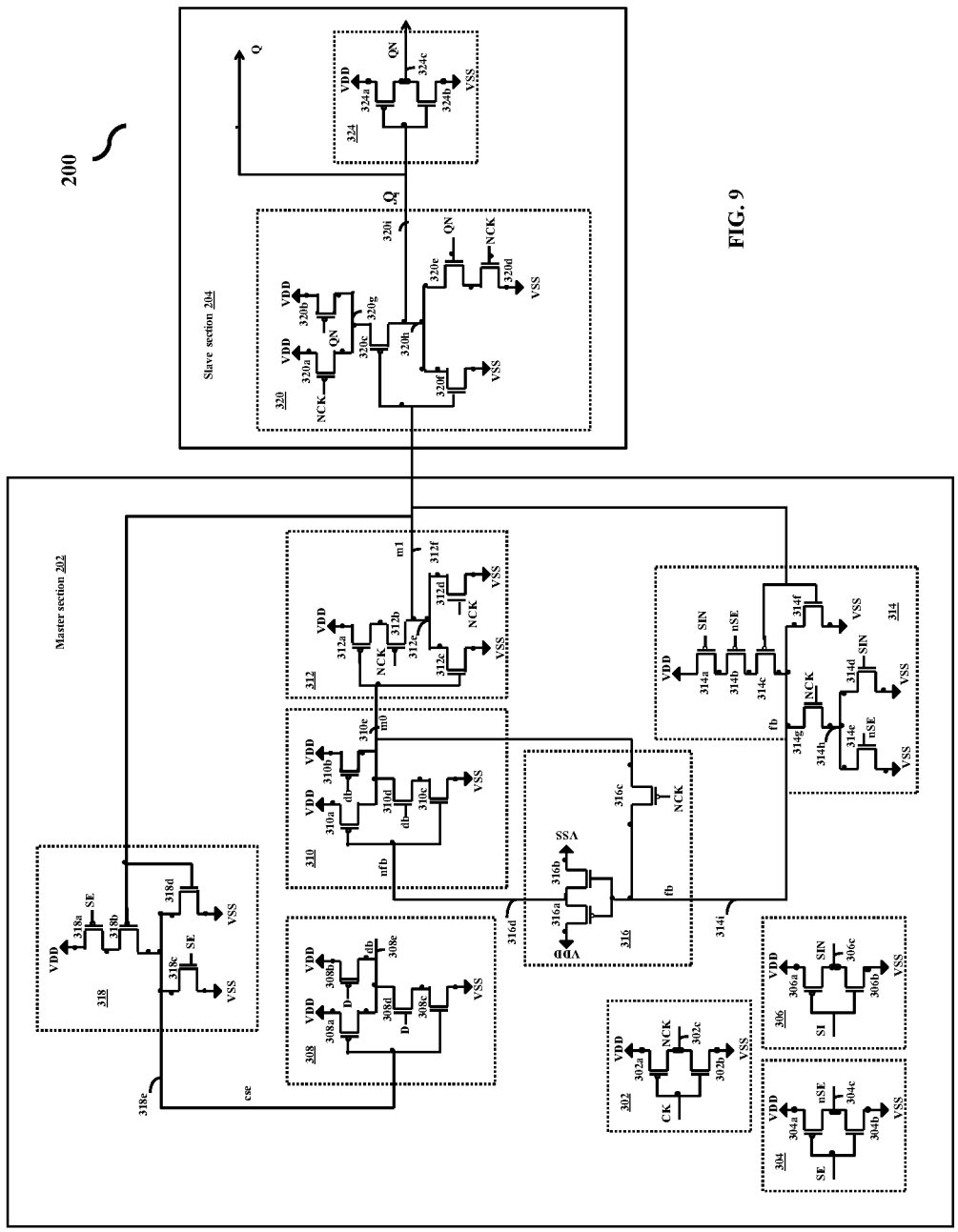
FIG. 9 is a circuit diagram of the flip-flop including both the bared inverted output QN and a non-inverted output Q, according to embodiments as disclosed herein.

FIG. 9 is a circuit diagram of the flip-flop 200 including both the bared inverted output QN and a non-inverted output Q, according to embodiments as disclosed herein.

The master section 202 of the flip-flop 202 can be configured to receive the data input D, the scan enable signal SE, the scan input signal SI, and the clock signal CK and to generate the master output signal m1. The master section 202 includes the first-ninth sub-sections (302-318) to generate the master output signal m1.

The first master sub-section 302 can be configured to perform the invert operation on the clock signal CK for outputting the inversion of the clock signal NCK on the first master sub-section output node 302*c*. The first master sub-section 302 includes the first PMOS transistor 302*a*, and the first NMOS transistor 302*b* for outputting the inversion of the clock signal NCK on the first master sub-section output node 302*c*. The second master sub-section 304 can be configured to perform the invert operation on the scan enable signal SE for outputting the inversion of the scan enable signal nSE on the second master sub-section output node 304*c*. The second master sub-section 304 includes the second PMOS transistor 304*a*, and the second NMOS transistor 304*b* for outputting the inversion of the scan enable signal nSE on the second master sub-section output node 304*c*. The third master sub-section 306 can be configured to perform the invert operation on the scan input signal SI for outputting the inversion of the scan input signal SIN on the third master sub-section output node 306*c*. The third master sub-section 306 includes the third PMOS transistor 306*a*, and the third NMOS transistor 306*b* for outputting the inversion of the scan input signal SIN on the third master sub-section output node 306*c*.

The fourth master sub-section 308 can be configured to perform the NAND operation on the data input D, and the internal control signal cse for outputting the inverted data signal db on the fourth master sub-section output node 308*e*. The fourth master sub-section 308 includes the fourth PMOS transistor 308*a*, the fifth PMOS transistor 308*b*, the fourth NMOS transistor 308*c*, and the fifth NMOS transistor 308*d* for outputting the inverted data signal db on the fourth master sub-section output node 308*e*. The fifth master sub-section 310 can be configured to perform the NAND operation on the inverted data signal db, and the master feedback signal nfb for outputting the internal master signal m0 on the fifth master sub-section output node 310*e*. The fifth master sub-section 310 includes the sixth PMOS transistor 310*a*, the seventh PMOS transistor 310*b*, the sixth NMOS transistor 310*c*, and the seventh NMOS transistor 310*d* for outputting the internal master signal m0 on the fifth master sub-section output node 310*e*. The sixth master sub-section 312 can be configured to perform the NOR operation on the internal signal m0 and the inversion of the clock signal NCK to generate the master output signal m1 on the sixth master sub-section output node 312f. The sixth master sub-section 312 includes the eighth PMOS transistor 312a, the ninth PMOS transistor 312b, the eighth NMOS transistor 312c, and the ninth NMOS transistor 312d for generating the master output signal m1 on the sixth master sub-section output node 312f.

The seventh master sub-section 314 can be configured to output the scan and clock mixing signal fb on the seventh master sub-section output node 314i as the function of the inversion of the clock signal NCK, the inversion of the scan enable signal nSE, the inversion of the scan input signal SI, and the master output signal m1. The seventh master sub-section 314 includes the tenth PMOS transistor 314a, the eleventh PMOS transistor 314b, the twelfth PMOS transistor 314c, the tenth NMOS transistor 314d, the eleventh NMOS transistor 314e, the twelfth NMOS transistor 314f, and the thirteenth NMOS transistor 314g for outputting the scan and clock mixing signal fb on the seventh master sub-section output node 314i. The eighth master sub-section 316 can be configured to perform the invert operation on the scan and clock mixing signal fb for outputting the master feedback signal nfb on the eighth master sub-section output node 316d. The eighth master sub-section 316 includes the thirteenth PMOS transistor 316a, and the fourteenth NMOS transistor 316b for outputting the master feedback signal nfb on the eighth master sub-section output node 316d. The eighth master sub-section 316 also includes the fourteenth PMOS transistor 316c to output the scan and clock mixing signal fb, when the scan and clock mixing signal fb of the seventh master sub-section 314 has not been connected to the eighth master sub-section 316 (i.e., when the master output signal m1=0, and the inversion of the scan input signal SIN=1 and the inversion of the scan enable signal nSE=1, and the inversion of the clock signal NCK=0). The ninth master sub-section 318 can be configured to perform the NOR operation on the master output signal m1, and the scan enable signal SE for outputting the internal control signal cse on the ninth master sub-section output node 318e. The ninth master sub-section 318 includes the fifteenth PMOS transistor 318a, the sixteenth PMOS transistor 318b, the fifteenth NMOS transistor 318c, and the sixteenth NMOS transistor 318d for outputting the internal control signal cse on the ninth master sub-section output node 318e. The configurations of the transistors of the first-ninth master sub-sections (302-318) and their intended functions are depicted in FIGS. 3a, and 3b.

The slave section 204 can be configured to receive the master output signal m1, and provide the bared inverted output QN. In an embodiment, the slave section 204 includes only two sections: the first slave sub-section 320, and the third sub-slave section 324 to provide the bared inverted output QN.

The first slave sub-section 320 can be configured to perform the complex AND-OR invert operation on the master output signal m1, the inversion of the clock signal NCK, and the bared inverted output QN for outputting the non-inverted output Q on the first slave sub-section output node 320i. The first slave sub-section 320 includes the seventeenth PMOS transistor 320a, the eighteenth PMOS transistor 320b, the nineteenth PMOS transistor 320c, the seventeenth NMOS transistor 320d, the eighteenth NMOS transistor 320e, and the nineteenth PMOS transistor 320f for outputting the non-inverted output Q on the first slave sub-section output node 320i.

The third slave sub-section 324 can be configured to receive the non-inverted output Q from the first slave sub-section 322, and to provide the bared inverted output QN on the output node 324c. The third slave sub-section 324 can perform the invert operation on the non-inverted output Q to provide the bared inverted output QN on the output node 324c. The configurations of the transistors of the first and third slave sub-sections 324 and their intended functions are depicted in FIG. 8.

Figure 10:
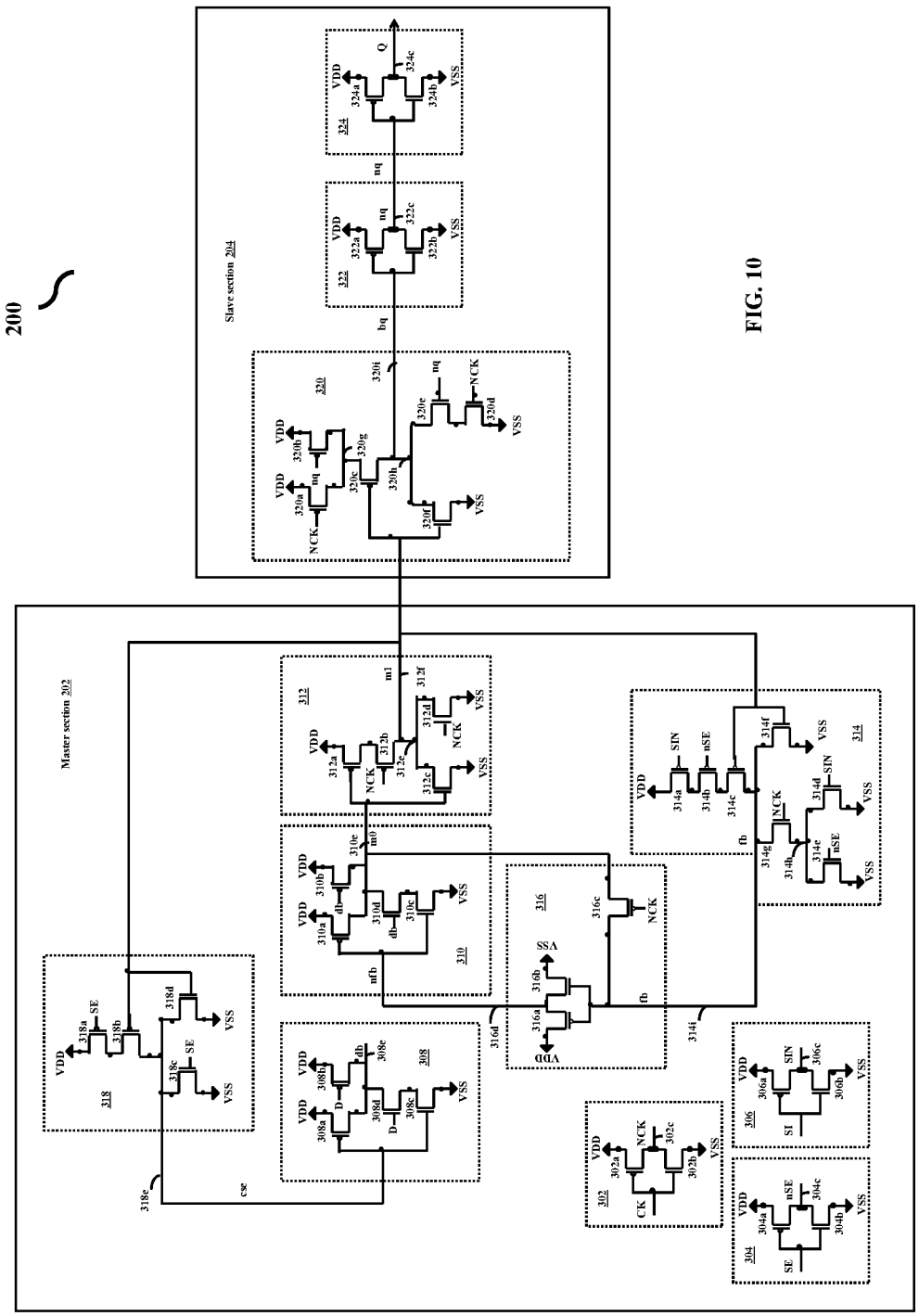
FIG. 10 is a circuit diagram depicting the flip-flop with the non-inverted output Q, according to embodiments as disclosed herein.

FIG. 10 is a circuit diagram depicting the flip-flop 200 with the non-inverted output Q, according to embodiments as disclosed herein.

The master section 202 of the flip-flop 202 can be configured to receive the data input D, the scan enable signal SE, the scan input signal SI, and the clock signal CK and to generate the master output signal m1. The master section 202 includes the first-ninth sub-sections (302-318) to generate the master output signal m1.

The first master sub-section 302 can be configured to perform the invert operation on the clock signal CK for outputting the inversion of the clock signal NCK on the first master sub-section output node 302c. The first master sub-section 302 includes the first PMOS transistor 302a, and the first NMOS transistor 302b for outputting the inversion of the clock signal NCK on the first master sub-section output node 302c. The second master sub-section 304 can be configured to perform the invert operation on the scan enable signal SE for outputting the inversion of the scan enable signal nSE on the second master sub-section output node 304c. The second master sub-section 304 includes the second PMOS transistor 304a, and the second NMOS transistor 304b for outputting the inversion of the scan enable signal nSE on the second master sub-section output node 304c. The third master sub-section 306 can be configured to perform the invert operation on the scan input signal SI for outputting the inversion of the scan input signal SIN on the third master sub-section output node 306c. The third master sub-section 306 includes the third PMOS transistor 306a, and the third NMOS transistor 306b for outputting the inversion of the scan input signal SIN on the third master sub-section output node 306c.

The fourth master sub-section 308 can be configured to perform the NAND operation on the data input D, and the internal control signal cse for outputting the inverted data signal db on the fourth master sub-section output node 308e. The fourth master sub-section 308 includes the fourth PMOS transistor 308a, the fifth PMOS transistor 308b, the fourth NMOS transistor 308c, and the fifth NMOS transistor 308d for outputting the inverted data signal db on the fourth master sub-section output node 308e. The fifth master sub-section 310 can be configured to perform the NAND operation on the inverted data signal db, and the master feedback signal nfb for outputting the internal master signal m0 on the fifth master sub-section output node 310e. The fifth master sub-section 310 includes the sixth PMOS transistor 310a, the seventh PMOS transistor 310b, the sixth NMOS transistor 310c, and the seventh NMOS transistor 310d for outputting the internal master signal m0 on the fifth master sub-section output node 310e. The sixth master sub-section 312 can be configured to perform the NOR operation on the internal signal m0 and the inversion of the clock signal NCK to generate the master output signal m1 on the sixth master sub-section output node 312f. The sixth master sub-section 312 includes the eighth PMOS transistor 312a, the ninth PMOS transistor 312b, the eighth NMOS transistor 312c, and the ninth NMOS transistor 312d for generating the master output signal m1 on the sixth master sub-section output node 312f.

The seventh master sub-section 314 can be configured to output the scan and clock mixing signal fb on the seventh master sub-section output node 314i as the function of the inversion of the clock signal NCK, the inversion of the scan enable signal nSE, the inversion of the scan input signal SI, and the master output signal m1. The seventh master sub-section 314 includes the tenth PMOS transistor 314a, the eleventh PMOS transistor 314b, the twelfth PMOS transistor 314c, the tenth NMOS transistor 314d, the eleventh NMOS transistor 314e, the twelfth NMOS transistor 314f, and the thirteenth NMOS transistor 314g for outputting the scan and clock mixing signal fb on the seventh master sub-section output node 314i. The eighth master sub-section 316 can be configured to perform the invert operation on the scan and clock mixing signal fb for outputting the master feedback signal nfb on the eighth master sub-section output node 316d. The eighth master sub-section 316 includes the thirteenth PMOS transistor 316a, and the fourteenth NMOS transistor 316b for outputting the master feedback signal nfb on the eighth master sub-section output node 316d. The eighth master sub-section 316 also includes the fourteenth PMOS transistor 316c to output the scan and clock mixing signal fb, when the scan and clock mixing signal fb of the seventh master sub-section 314 has not been connected to the eighth master sub-section 316 (i.e., when the master output signal m1=0, and the inversion of the scan input signal SIN=1 and the inversion of the scan enable signal nSE=1, and the inversion of the clock signal NCK=0). The ninth master sub-section 318 can be configured to perform the NOR operation on the master output signal m1, and the scan enable signal SE for outputting the internal control signal cse on the ninth master sub-section output node 318e. The ninth master sub-section 318 includes the fifteenth PMOS transistor 318a, the sixteenth PMOS transistor 318b, the fifteenth NMOS transistor 318c, and the sixteenth NMOS transistor 318d for outputting the internal control signal cse on the ninth master sub-section output node 318e. The configurations of the transistors of the first-ninth master sub-sections (302-318) and their intended functions are depicted in FIGS. 3a, and 3b.

The slave section 204 can be configured to provide the non-inverted output Q on the output node 324c based on the master output signal m1 generated by the master section 202. The slave section 204 includes the first slave sub-section 320, the second slave sub-section 322, and the third slave sub-section 324. The first slave sub-section 320 can be configured to perform the complex AND-OR invert operation on the master output signal m1, the inversion of the clock signal NCK, and the slave feedback signal nq for outputting the internal Boolean signal bq on the first slave sub-section output node 320i. The first slave sub-section 320 includes the seventeenth PMOS transistor 320a, the eighteenth PMOS transistor 320b, the nineteenth PMOS transistor 320c, the seventeenth NMOS transistor 320d, the eighteenth NMOS transistor 320e, and the nineteenth PMOS transistor 320f for outputting the internal Boolean signal bq on the first slave sub-section output node 320i. The second slave sub-section 322 can be configured to perform the invert operation on the internal Boolean signal bq for outputting the slave feedback signal nq on the second slave sub-section output node 322c. The second slave sub-section 322 includes the twentieth PMOS transistor 322a, and the twentieth NMOS transistor 322b for outputting the slave feedback signal nq on the second slave sub-section output node 322c. The configurations of the transistors of the first, and second slave sub-sections (320, and 322) and their intended functions are depicted in FIGS. 3a, and 3c.

The third slave sub-section 324 can be configured to perform the invert operation on the slave feedback signal nq to provide the non-inverted output Q on the output node 324c. The third slave sub-section 324 includes the twenty-first PMOS transistor 324a, and the twenty-first NMOS transistor 324b for providing the non-inverted output Q on the output node 324c. The twenty-first PMOS transistor 324a can be connected to the VDD voltage, the slave feedback signal nq outputted on the second slave sub-section output node 322c, and the output node 324c. The twenty-first PMOS transistor 322a includes the source connected to the VDD voltage, the gate connected to the slave feedback signal nq, and the drain connected to the output node 324c. The twenty-first NMOS transistor 324b can be connected to the VSS voltage, the slave feedback signal nq outputted on the second slave sub-section output node 322c, and the output node 324c. The twenty-first NMOS transistor 324b includes the source connected to the VSS voltage, the gate connected to the slave feedback signal nq, and the drain connected to the output node 324c. In an embodiment, when the slave feedback signal nq=0, the twenty-first PMOS transistor 324a turns ON and provides the non-inverted output Q=1 on the output node 324c. In an embodiment, when the slave feedback signal nq=1, the twenty-first NMOS transistor 324b turns ON and provides the non-inverted output Q=0 on the output node 324c.

Figure 11:
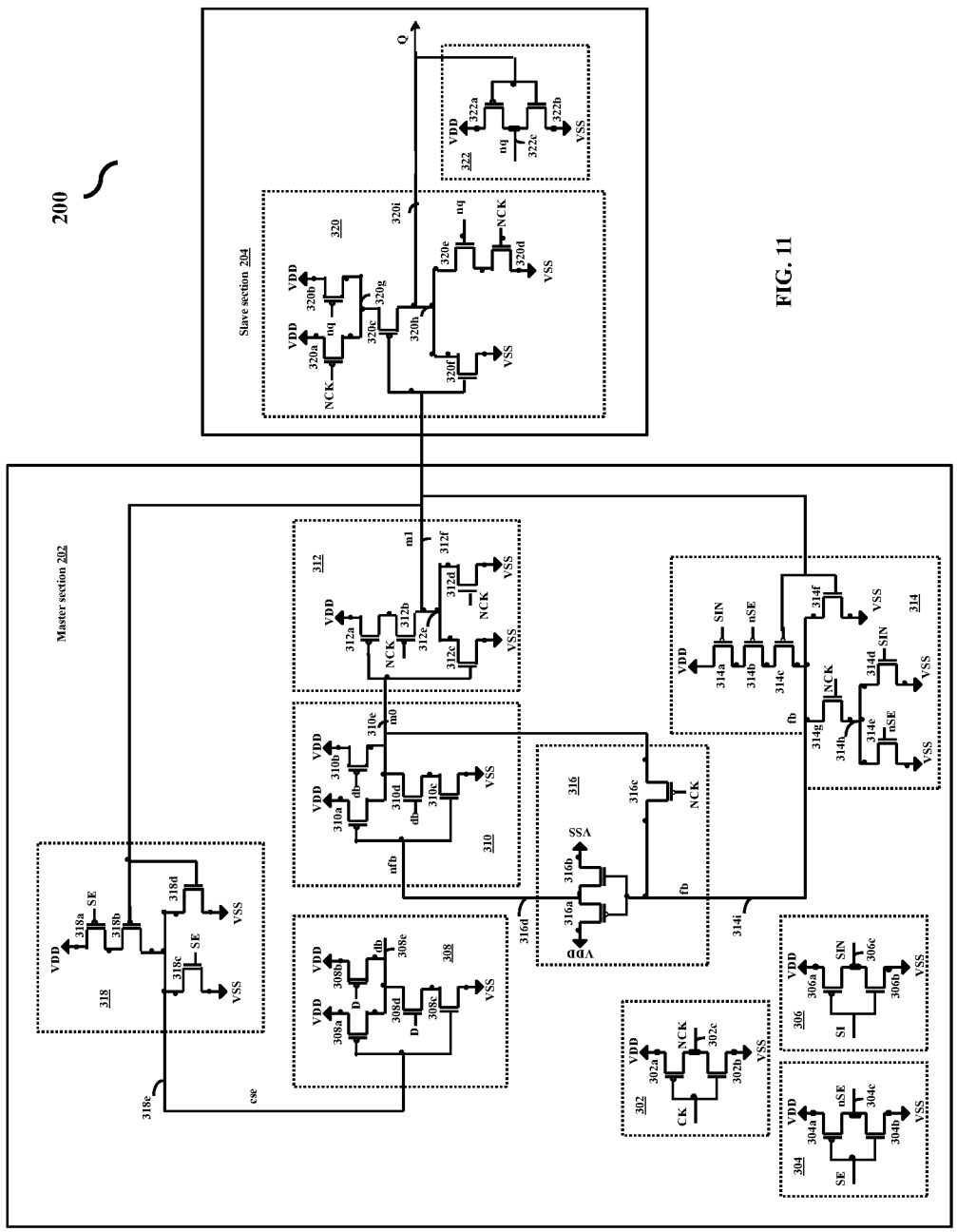
FIG. 11 is a circuit diagram depicting the flip-flop including a bared output Q, according to embodiments as disclosed herein.

FIG. 11 is a circuit diagram depicting the flip-flop 200 including a bared output Q, according to embodiments as disclosed herein.

The master section 202 of the flip-flop 202 can be configured to receive the data input D, the scan enable signal SE, the scan input signal SI, and the clock signal CK and to generate the master output signal m1. The master section 202 includes the first-ninth sub-sections (302-318) to generate the master output signal m1.

The first master sub-section 302 can be configured to perform the invert operation on the clock signal CK for outputting the inversion of the clock signal NCK on the first master sub-section output node 302c. The first master sub-section 302 includes the first PMOS transistor 302a, and the first NMOS transistor 302b for outputting the inversion of the clock signal NCK on the first master sub-section output node 302c. The second master sub-section 304 can be configured to perform the invert operation on the scan enable signal SE for outputting the inversion of the scan enable signal nSE on the second master sub-section output node 304c. The second master sub-section 304 includes the second PMOS transistor 304a, and the second NMOS transistor 304b for outputting the inversion of the scan enable signal nSE on the second master sub-section output node 304c. The third master sub-section 306 can be configured to perform the invert operation on the scan input signal SI for outputting the inversion of the scan input signal SIN on the third master sub-section output node 306c. The third master sub-section 306 includes the third PMOS transistor 306a, and the third NMOS transistor 306b for outputting the inversion of the scan input signal SIN on the third master sub-section output node 306c.

The fourth master sub-section 308 can be configured to perform the NAND operation on the data input D, and the internal control signal cse for outputting the inverted data signal db on the fourth master sub-section output node 308e. The fourth master sub-section 308 includes the fourth PMOS transistor 308a, the fifth PMOS transistor 308b, the fourth NMOS transistor 308c, and the fifth NMOS transistor 308d for outputting the inverted data signal db on the fourth master sub-section output node 308e. The fifth master sub-section 310 can be configured to perform the NAND operation on the inverted data signal db, and the master feedback signal nfb for outputting the internal master signal m0 on the fifth master sub-section output node 310e. The fifth master sub-section 310 includes the sixth PMOS transistor 310a, the seventh PMOS transistor 310b, the sixth NMOS transistor 310c, and the seventh NMOS transistor 310d for outputting the internal master signal m0 on the fifth master sub-section output node 310e. The sixth master sub-section 312 can be configured to perform the NOR operation on the internal signal m0 and the inversion of the clock signal NCK to generate the master output signal m1 on the sixth master sub-section output node 312f. The sixth master sub-section 312 includes the eighth PMOS transistor 312a, the ninth PMOS transistor 312b, the eighth NMOS transistor 312c, and the ninth NMOS transistor 312d for generating the master output signal m1 on the sixth master sub-section output node 312f.

The seventh master sub-section 314 can be configured to output the scan and clock mixing signal fb on the seventh master sub-section output node 314i as the function of the inversion of the clock signal NCK, the inversion of the scan enable signal nSE, the inversion of the scan input signal SI, and the master output signal m1. The seventh master sub-section 314 includes the tenth PMOS transistor 314a, the eleventh PMOS transistor 314b, the twelfth PMOS transistor 314c, the tenth NMOS transistor 314d, the eleventh NMOS transistor 314e, the twelfth NMOS transistor 314f, and the thirteenth NMOS transistor 314g for outputting the scan and clock mixing signal fb on the seventh master sub-section output node 314i. The eighth master sub-section 316 can be configured to perform the invert operation on the scan and clock mixing signal fb for outputting the master feedback signal nfb on the eighth master sub-section output node 316d. The eighth master sub-section 316 includes the thirteenth PMOS transistor 316a, and the fourteenth NMOS transistor 316b for outputting the master feedback signal nfb on the eighth master sub-section output node 316d. The eighth master sub-section 316 also includes the fourteenth PMOS transistor 316c to output the scan and clock mixing signal fb, when the scan and clock mixing signal fb of the seventh master sub-section 314 has not been connected to the eighth master sub-section 316 (i.e., when the master output signal m1=0, and the inversion of the scan input signal SIN=1 and the inversion of the scan enable signal nSE=1, and the inversion of the clock signal NCK=0). The ninth master sub-section 318 can be configured to perform the NOR operation on the master output signal m1, and the scan enable signal SE for outputting the internal control signal cse on the ninth master sub-section output node 318e. The ninth master sub-section 318 includes the fifteenth PMOS transistor 318a, the sixteenth PMOS transistor 318b, the fifteenth NMOS transistor 318c, and the sixteenth NMOS transistor 318d for outputting the internal control signal cse on the ninth master sub-section output node 318e. The configurations of the transistors of the first-ninth master sub-sections (302-318) and their intended functions are depicted in FIGS. 3a, and 3b.

The slave section 204 can be configured to provide the bared output Q based on the master output signal m1 generated by the master section 202, and the slave feedback signal. The slave section 204 includes the first slave sub-section 320, and the second slave sub-section 322. The first slave sub-section 320 can be configured to perform the complex AND-OR invert operation on the master output signal m1, the inversion of the clock signal NCK, and the slave feedback signal nq for outputting the bared output Q on the first slave sub-section output node 320i. The first slave sub-section 320 includes the seventeenth PMOS transistor 320a, the eighteenth PMOS transistor 320b, the nineteenth PMOS transistor 320c, the seventeenth NMOS transistor 320d, the eighteenth NMOS transistor 320e, and the nineteenth PMOS transistor 320f for outputting the bared output Q on the first slave sub-section output node 320i.

The second slave sub-section 322 can be configured to perform the invert operation on the bared output Q for outputting the slave feedback signal nq on the second slave sub-section output node 322c. The second slave sub-section 322 includes the twentieth PMOS transistor 322a, and the twentieth NMOS transistor 322b for outputting the slave feedback signal nq on the second slave sub-section output node 322c. The configurations of the transistors of the first, and second slave sub-sections (320, 322, and 324) and their intended functions are depicted in FIGS. 3a, and 3c.

Figure 12:
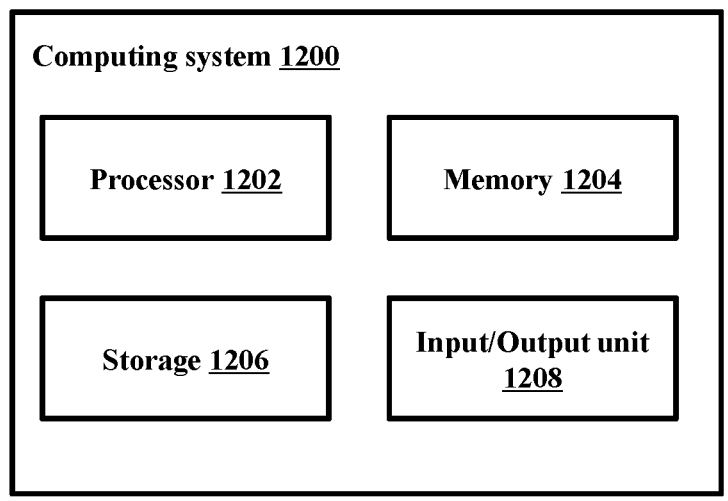
FIG. 12 depicts an exemplary computing system including the flip-flop, according to embodiments as disclosed herein.

FIG. 12 depicts an exemplary computing system 1200 including the flip-flop 200, according to embodiments as disclosed herein. The computing system 1200 includes a processor 1202, a memory 1204, a storage 1206, an input/output unit 1206, and so on. In embodiment, at least one of, but not limited to, a plurality of semiconductor devices, integrated circuits, sequential logic circuits, and so on, which are included in the processor 1202, the memory 1204, the storage 1206, and the input/output unit 1208 may include the flip-flop 200.

The processor 1202 may perform certain arithmetic operations or tasks. In an embodiment, the processor 1202 can be at least one of a single processer, a plurality of processors, multiple homogenous cores, multiple heterogeneous cores, multiple Central Processing Unit (CPUs) of different kinds and so on. The processor 1202 may communicate with the memory 1204, the storage 1206, and the input/output unit 1208 through a bus such as an address bus, a control bus, a data bus, and/or the like. The processor 1202 may also be connected to an extension bus such as a peripheral component interconnect (PCI) bus or the like.

The memory 1204 may store data necessary for an operation of the computing system 1202. The memory 1204 may include one or more computer-readable storage media. The memory 1204 may include non-volatile storage elements. Examples of such non-volatile storage elements may include magnetic hard discs, optical discs, floppy discs, flash memories, or forms of electrically programmable memories (EPROM) or electrically erasable and programmable (EEPROM) memories. In addition, the memory 1604 may, in some examples, be considered a non-transitory storage medium. The term "non-transitory" may indicate that the storage medium is not embodied in a carrier wave or a propagated signal. However, the term "non-transitory" should not be interpreted to mean that the memory 1204 is non-movable. In certain examples, a non-transitory storage medium may store data that can, over time, change (e.g., in Random Access Memory (RAM) or cache). In addition, the memory 1204 may include, but is not limited to, a dynamic random access memory (DRAM), a mobile DRAM, a static random access memory (SRAM), a phase-change random access memory (PRAM), a ferroelectric random access memory (FRAM), a resistive random access memory (RRAM), a magnetic random access memory (MRAM), and so on.

The storage 1206 may include a solid state drive, a hard disk drive, a CD-ROM, and/or the like. The input/output unit 1208 may include an input means, such as a keyboard, keypad, a mouse, and/or the like, and an output means such as a printer, a display, and/or the like.

The embodiments disclosed herein can be implemented through at least one software program running on at least one hardware device and performing network management functions to control the elements. The elements shown in FIGS. 2a-12 can be at least one of a hardware device, or a combination of hardware device and software module.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments, those skilled in the art will recognize that the embodiments herein can be practiced with modification within the spirit and scope of the embodiments as described herein.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments, those skilled in the art will recognize that the embodiments herein can be practiced with modification within the spirit and scope of the embodiments as described herein.

That which is claimed is:

1. A flip-flop (200) comprising:
a master section (202) configured to:
latch at least one of a data input and a scan input signal based on a scan enable signal, when a clock signal is at a logic low level; and
retain previously latched at least one of the data input and the scan input signal, when the clock signal is at a high logic level; and
a slave section (204) coupled to an output of the master section (202) and configured to:
generate an inverted output QN using the latched at least one of the data input and the scan input signal received from the master section (202), at a positive edge of the clock signal; and
retain a previous value of the inverted output QN, when the clock signal is at the logic low level; and
wherein said master section is further configured to feed back a master section output signal at the output of the master section to: (i) first boolean logic, which is also responsive to the scan enable signal and the data input, and (ii) second boolean logic, which is also responsive to an inversion of the scan input signal and an inversion of the scan enable signal.

2. The flip-flop (200) of claim 1, wherein the flip-flop (200) is a scan D flip-flop configured to perform at least one of a data storage operation, and a scan test operation.

3. The flip-flop (200) of claim 1, wherein an inversion of the clock signal is applied to sub-sections of the master section (202) that reduces a setup time of the flip-flop (200) to a negative value; and wherein said master section further comprises third boolean logic, which is responsive to an output of the first boolean logic and an output of the second boolean logic.

4. The flip-flop (200) of claim 1, wherein the master section (202) includes:
a first master sub-section (302) configured to:
output an inversion of the clock signal on a first master sub-section output node (302c) by performing an invert operation on the clock signal;
a second master sub-section (304) configured to:
output an inversion of the scan enable signal on a second master sub-section output node (304c) by performing the invert operation on the scan enable signal;
a third master sub-section (306) configured to:
output an inversion of the scan input signal on a third master sub-section output node (306c) by performing the invert operation on the scan input signal;
a fourth master sub-section (308) configured to:
output an inverted data signal on a fourth master sub-section output node (308e) by performing a NAND operation on an internal control signal received from a ninth master sub-section of the master section (202) and the data input; and
a fifth master sub-section (310) configured to:
output an internal master signal on a fifth master sub-section output node (310e) by performing the NAND operation on the inverted data signal received from the fourth master sub-section (308), and a master feedback signal received from an eighth master sub-section (316); and
a sixth master sub-section (312) configured to:
generate a master output signal on a sixth master sub-section output node (312f) by performing a NOR operation on the internal master signal received from the fifth master sub-section (310) and the inversion of the clock signal received from the first master sub-section (302).

5. The flip-flop (200) of claim 4, wherein the internal master signal corresponds to the latched at least one of the data input and the scan input signal, when the clock signal is at the low logic level, wherein the internal master signal corresponds to a previous value of the latched at least one of the data input and the scan input signal, when the clock signal is at the high logic level.

6. The flip-flop (200) of claim 4, wherein
the first master sub-section (302) includes a first P-type Metal Oxide Semiconductor (PMOS) transistor (302a), and a first N-type Metal Oxide Semiconductor (NMOS) transistor (302b) to output the inversion of the clock signal on the first master sub-section output node (302c);
the second master sub-section (304) includes a second PMOS transistor (304a) and a second NMOS transistor (304b) to output the inversion of the scan enable signal on the second master sub-section output node (304c);
the third master sub-section (306) includes a third PMOS transistor (306a) and a third NMOS transistor (306b) to output the inversion of the scan input signal on the third master sub-section output node (306c);
the fourth master sub-section (308) includes a fourth PMOS transistor (308a), a fifth PMOS transistor (308b), a fourth NMOS transistor (308c), and a fifth NMOS transistor (308d) to output the inverted data signal on the fourth master sub-section output node (308e);

the fifth master sub-section (310) includes a sixth PMOS transistor (310a), a seventh PMOS transistor (310b), a sixth NMOS transistor (310c), and a seventh NMOS transistor (310d) to output the internal master signal on the fifth master sub-section output node (310e); and the sixth master sub-section (312) includes an eighth PMOS transistor (312a), a ninth PMOS transistor (312b), an eighth NMOS transistor (312c), and a ninth NMOS transistor (312d) to generate the master output signal on the sixth master sub-section output node (312f).

7. The flip-flop (200) of claim 6, wherein the ninth NMOS transistor (312d) discharges the master output signal to zero for a half of the phase of the clock signal.

8. The flip-flop (200) of claim 6, wherein
the first PMOS transistor (302a) includes a source connected to a VDD voltage, a gate connected to the clock signal and a drain connected to the first master sub-section output node (302c); and
the first NMOS transistor (302b) includes a source connected to a VSS voltage, a gate connected to the clock signal and a drain connected to the first master sub-section output node (302c).

9. The flip-flop (200) of claim 6, wherein
the second PMOS transistor (304a) includes a source connected to the VDD voltage, a gate connected to the scan enable signal and a drain connected to the second master sub-section output node (304c); and
the second NMOS transistor (304b) includes a source connected to the VSS voltage, a gate connected to the scan enable signal and a drain connected to the second master sub-section output node (304c).

10. The flip-flop (200) of claim 6, wherein
the third PMOS transistor (306a) includes a source connected to the VDD voltage, a gate connected to the scan input signal and a drain connected to the third master sub-section output node (306c); and
the third NMOS transistor (306b) includes a source connected to the VSS voltage, a gate connected to the scan input signal and a drain connected to the third master sub-section output node (306c).

11. The flip-flop (200) of claim 6, wherein
the fourth PMOS transistor (308a) includes a source connected to the VDD voltage, a gate connected to the internal control signal, and a drain connected to the fourth master sub-section output node (308e);
the fifth PMOS transistor (308b) includes a source connected to the VDD voltage, a gate connected to the data input, and a drain connected to the fourth master sub-section output node (308e);
the fourth NMOS transistor (308c) includes a source connected to the VSS voltage, a gate connected to the internal control signal, and a drain connected to a source of the fifth NMOS transistor (308d); and
the fifth NMOS transistor (308d) includes a gate connected to the data input, and a drain connected to the fourth master sub-section output node (308e).

12. The flip-flop (200) of claim 6, wherein
the sixth PMOS transistor (310a) includes a source connected to the VDD voltage, a gate connected to the master feedback signal, and a drain connected to the fifth master sub-section output node (310e);

the seventh PMOS transistor (310b) includes a source connected to the VDD voltage, a gate connected to the inverted data signal, and a drain connected to the fifth master sub-section output node (310e);
the sixth NMOS transistor (310c) includes a source connected to the VSS voltage, a gate connected to the master feedback signal, and a drain connected to a source of the seventh NMOS transistor (310d); and
the seventh NMOS transistor (310d) includes a gate connected to the inverted data signal, and a drain connected to the fifth master sub-section output node (310e).

13. The flip-flop (200) of claim 6, wherein
the eighth PMOS transistor (312a) includes a source connected to the VDD voltage, a gate connected to the internal master signal, and a drain connected to a source of the ninth PMOS transistor (312b);
the ninth PMOS transistor (312b) includes a gate connected to the inversion of the clock signal and a drain connected to the sixth master sub-section output node (312f);
the eighth NMOS transistor (312c) includes a source connected to the VSS voltage, a gate connected to the internal master signal, and a drain connected to the first conjunction node (312e), wherein the first conjunction node (312e) is connected to the sixth master sub-section output node (312f); and
the ninth NMOS transistor (312d) includes a source connected to the VSS voltage, a gate connected to the inversion of the clock signal, and a drain connected to the first conjunction node (312e).

14. The flip-flop (200) of claim 4, wherein on a feedback path, the master section (202) further comprises:
a seventh master sub-section (314) configured to:
output a scan and clock mixing signal on a seventh master sub-section output node (314i) as a complex function of the inversion of the clock signal, the inversion of the scan enable signal, the inversion of the scan input signal, and the master output signal received from the first, second, third and sixth master sub-sections (302, 304, 306, and 312) respectively;
the eighth master sub-section (316) configured to:
output the master feedback signal on an eighth master sub-section output node (316d) by performing the invert operation on the scan and clock mixing signal received from the seventh master sub-section (314); and
the ninth master sub-section (318) configured to:
output the internal control signal on a ninth master sub-section output node (318e) by performing the NOR operation on the master feedback signal received from the sixth master sub-section (312), and the scan enable signal.

15. The flip-flop (200) of claim 14, wherein
the seventh master sub-section (314) includes a tenth PMOS transistor (314a), a eleventh PMOS transistor (314b), a twelfth PMOS transistor (314c), a tenth NMOS transistor (314d), a eleventh NMOS transistor (314e), a twelfth NMOS transistor (314f), and a thirteenth NMOS transistor (314g) to output the scan and clock mixing signal on the seventh master sub-section output node 314i;
the eighth master sub-section (316) includes a thirteenth PMOS transistor (316a), and a fourteenth NMOS transistor (316b) to output the master feedback signal on the eighth master sub-section output node (316d); and the ninth master sub-section (318) includes a fifteenth PMOS transistor (318a), a sixteenth PMOS transistor (318b), a fifteenth NMOS transistor (318c), and a sixteenth NMOS transistor (318d) to output the internal control signal on the ninth master sub-section output node (318e).

16. The flip-flop (200) of claim 15, wherein
the tenth PMOS transistor (314a) includes a source connected to the VDD voltage, a gate connected to the inversion of the scan input signal, and a drain connected to a source of the eleventh PMOS transistor (314b);
the eleventh PMOS transistor (314b) includes a gate connected to the inversion of the scan enable signal, and a drain connected to a source of the twelfth PMOS transistor (314c);
the twelfth PMOS transistor (314c) includes a gate connected to the master output signal, and a drain connected to the seventh master sub-section output node (314i);
the tenth NMOS transistor (314d) includes a source connected to the VSS voltage, a gate connected to the inversion of the scan input signal, and a drain connected to the second conjunction node (314h);
the eleventh NMOS transistor (314e) includes a source connected to the VSS voltage, a gate connected to the inversion of the scan enable signal, and a drain connected to the second conjunction node (314h);
the twelfth NMOS transistor (314f) includes a source connected to the VSS voltage, a gate connected to the master output signal, and a drain connected to the seventh master sub-section output node (314i); and
the thirteenth NMOS transistor (314g) includes a source connected to the second conjunction node (314h), a gate connected to the inversion of the clock signal, and a drain connected to the seventh master sub-section output node (314i).

17. A flip-flop (200) comprising:
a master section (202) configured to receive a negative clock signal for performing at least one function by lowering a setup time of the flip-flop (200) to a negative value; and
a slave section (204) configured to generate an inverted output based on the at least one function performed by the master section (202); and
wherein said master section is further configured to feed back a master section output signal at an output of the master section to: (i) first boolean logic, which is also responsive to a scan enable signal and a data input, and (ii) second boolean logic, which is also responsive to an inversion of a scan input signal and an inversion of the scan enable signal.

18. The flip-flop (200) of claim 17, wherein the at least one function includes at least one of:
latching at least one of the data input and the scan input signal based on the scan enable signal; and
retaining previously latched at least one of the data input and the scan input signal.

19. The flip-flop (200) of claim 17, wherein the inverted output corresponds to an inversion of the latched at least one of the data input and the scan input signal or a previous inverted output; and wherein said master section further comprises third boolean logic, which is responsive to: (i) an output of the first boolean logic, (ii) an output of the second boolean logic, and (iii) the negative clock signal.

20. A flip-flop(200) comprising:
a master section (202); and
a slave section (204),
wherein the master section (202) includes,
a first master sub-section (302) configured to receive a clock signal (CK) and to output an inversion of the clock signal (NCK);
a second master sub-section (304) configured to receive a scan enable signal (SE) and to output an inversion of the scan enable signal (nSE);
a third master sub-section (306) configured to receive a scan input signal (SI) and to output an inversion of the scan input signal (SIN);
a fourth master sub-section (308) configured to receive a data input (D) and an internal control signal (cse), and to output an inverted data signal (db);
a fifth master sub-section (310) configured to receive the inverted data signal (db) and a master feedback signal (nfb), and to output an internal master signal (m0);
a sixth master sub-section (312) configured to receive the internal master signal (m0) and the inversion of the clock signal (NCK), and to generate a master output signal (m1);
a seventh master sub-section (314) configured to receive the inversion of the clock signal (NCK), the inversion of the scan enable signal (nSE), the inversion of the scan input signal (SI), and the master output signal (m1), and to output a scan and clock mixing signal (fb);
an eight master sub-section (316) configured to receive the scan and clock mixing signal (fb) and to output a master feedback signal (nfb); and
a ninth master sub-section (318) configured to receive the master output signal (m1) and the scan enable signal (SE), and to output the internal control signal (cse).

* * * * *